United States Patent
Chisholm et al.

(10) Patent No.: US 9,650,711 B2
(45) Date of Patent: May 16, 2017

(54) EFFICIENT AND SIMPLE METHOD FOR METALORGANIC CHEMICAL VAPOR DEPOSITION

(71) Applicant: SAFCELL, INC., Pasedena, CA (US)

(72) Inventors: Calum R. I. Chisholm, Oakland, CA (US); Alex Papandrow, Knoxville, TN (US)

(73) Assignee: California Institute of Technology, Office of Technology Transfer, Pasadena, CA (US)

( * ) Notice: Subject to any disclaimer, the term of this patent is extended or adjusted under 35 U.S.C. 154(b) by 616 days.

(21) Appl. No.: 13/627,758

(22) Filed: Sep. 26, 2012

(65) Prior Publication Data

US 2013/0273246 A1 Oct. 17, 2013

Related U.S. Application Data

(60) Provisional application No. 61/539,142, filed on Sep. 26, 2011.

(51) Int. Cl.
| | |
|---|---|
| *C23C 16/18* | (2006.01) |
| *C23C 16/40* | (2006.01) |
| *C23C 16/44* | (2006.01) |
| *H01M 4/88* | (2006.01) |
| *H01M 4/92* | (2006.01) |
| *H01M 8/1016* | (2016.01) |

(52) U.S. Cl.
CPC .............. *C23C 16/18* (2013.01); *C23C 16/40* (2013.01); *C23C 16/4417* (2013.01); *H01M 4/881* (2013.01); *H01M 4/8867* (2013.01); *H01M 4/92* (2013.01); *H01M 8/1016* (2013.01)

(58) Field of Classification Search
None
See application file for complete search history.

(56) References Cited

U.S. PATENT DOCUMENTS

| | | | |
|---|---|---|---|
| 6,193,911 B1 * | 2/2001 | Hunt | C23C 16/40 252/500 |
| 6,368,665 B1 * | 4/2002 | Hunt | B05D 1/08 427/250 |
| 2001/0048970 A1 * | 12/2001 | Hagemeyer et al. | 427/217 |
| 2006/0014068 A1 * | 1/2006 | Boysen et al. | 429/33 |
| 2009/0148740 A1 * | 6/2009 | Farag et al. | 429/30 |

OTHER PUBLICATIONS

Chisholm et al, Electrochemical Society Interface, 18(3), pp. 53-59, 2009.*
Papandrew et al, Chem. Mater., 23, pp. 1659-1667, published Mar. 15, 2011.*
Serp et al, Studies in Surface Science and Catalysis, 130, pp. 1001-1006, 2000.*
Hierso et al, Applied Organometallic Chemistry, vol. 12, pp. 161-172, 1998.*
Christoglou et al, Surface and Coatings Technology, 201, pp. 9195-9199, 2007.*

* cited by examiner

*Primary Examiner* — Erma Cameron
(74) *Attorney, Agent, or Firm* — Kilpatrick, Townsend & Stockton LLP

(57) ABSTRACT

The present invention provides a method of preparing metal or metal oxide particles on a substrate by forming a reaction mixture of a metal or metal oxide precursor and a substrate, and heating the reaction mixture at reduced pressure, such that metal or metal oxide particles are formed on the substrate.

20 Claims, 16 Drawing Sheets

EFFICIENT AND SIMPLE METHOD FOR METALORGANIC CHEMICAL VAPOR DEPOSITION

CROSS-REFERENCES TO RELATED APPLICATIONS

This application claims priority to U.S. Provisional Application No. 61/539,142, filed Sep. 26, 2011, which is incorporated in its entirety herein for all purposes.

BACKGROUND OF THE INVENTION

Metalorganic chemical vapor deposition (MOCVD) is a process used to synthesize materials by means of a chemical reaction in a vapor of a metal-organic precursor. The chemical reaction breaks apart the precursor molecules and deposits metals or metals oxides on a substrate material. The organic portion of the precursor returns to the gaseous phase. The deposited metals or metal oxides may be particles with nanometer sized dimensions (and therefore, large surface area to mass ratios)

It is often desirable that the MOCVD reactions occur on a specific substrate surface, such that the surface is covered by discrete particles, a network of particles, or a continuous film of deposited material. Previously reported MOCVD methods use a flowing stream of the precursor vapor, which may be mixed with an inert carrier gas. The reactant stream flows over or through the substrate. The substrate is often heated, so as to induce the chemical conversion of molecules of precursor which collide with the substrate surface from the vapor phase. This heating may be applied to the entire deposition chamber ("hot-wall" CVD) or may be applied only to the substrate by means of inductive heating ("cold wall" CVD). A catalytic "hot wire" or a plasma may also be present to encourage the deposition reaction.

Convection based MOCVD methods show poor performance in depositing uniform coatings on powders and highly porous materials/structures, which may have a very large surface areas and do not present all available surfaces to a convective reactant flow. Some methods devised to cope with this problem for powdered materials are fluidized bed reactors that agitate the substrate powder by flowing the reactant vapor through the powder via a fritted disc. However, to date known methods devised to deposit metal or metal oxide particles on powders and highly porous materials/structures are inefficient with respect to the use of the metal-organic precursors and/or complex and expensive in design, inhibiting the commercial viability of such methods. A method for efficiently depositing metal/metal oxide particles on powders and highly porous materials/structures was therefore developed.

Metal or metal oxide nanoparticles supported on the surfaces of high surface area materials/structures are required for the catalysis of chemical reactions in many chemical and electrochemical devices. For both chemical and electrochemical devices, these functional metal or metal oxide particles are dispersed on supporting materials. In the case of chemical devices, the supporting material is usually a chemically and thermally stable material with high surface area. For electrochemical devices, the functional metal or metal oxide particles are typically dispersed on electrically conductive supports or inside highly porous electrodes which conduct both electrons and ions, and have high gas permeability.

Chemical devices containing functional metal or metal oxide materials perform a multitude of heterogeneous reactions. Such reactions include fuel reforming (e.g. steam reforming, partial-oxidation, auto-thermal), hydrolysis (e.g., hydrogen production from water), hydrogenation (e.g., reaction of hydrogen with fats to form margarine), and more generically, catalytic reduction (e.g. ammonia formation from nitrogen) and oxidation (e.g., water gas shift and nitric acid formation from ammonia) reactions. Highly dispersed metal or metal oxide catalyst particles with high surface areas are desirable as increased catalyst surface area typically increases overall device reaction rates.

Electrochemical devices with functional metal or metal oxide materials in their electrodes are used in variety of applications including batteries, fuel cells, hydrogen pumps, electrolysis cells, supercapacitors, sensors, hydrogen separation membranes and membrane reactors. Highly dispersed and high surface area metal or metal oxide particles in the electrodes of electrochemical devices are often essential in promoting fast reaction and intercalation rates, and more generally, the fast charge transfer rates measured in highly active electrodes. The overall functionality of most electrochemical devices is then highly dependent on the chemical and physical nature of the functional metal or metal oxide particles.

In particular, the chemical and physical nature of the functional metal or metal oxide particles in fuel cell electrodes are critical to high performance and fuel conversion efficiencies, and therefore critical to the overall commercial viability of a fuel cell system. Fuel cells are attractive alternatives to combustion engines for power generation, because of their higher efficiency and the lower level of pollutants produced from their operation. A fuel cell generates electricity from the electrochemical reaction of a fuel, e.g. methane, methanol, gasoline, or hydrogen, with oxygen normally obtained from air.

There are three common types of fuel cells i.e., 1) direct hydrogen/air fuel cells, in which hydrogen is stored and then delivered to the fuel cell as needed; 2) indirect hydrogen/air fuel cells, in which hydrogen is generated on site from a hydrocarbon fuel, cleaned of carbon monoxide, and subsequently fed to the fuel cell; and 3) direct alcohol fuel cells, such as methanol ("DMFC"), ethanol, isopropanol and the like, in which an alcohol/water solution is directly supplied to the fuel cell. An example of this later fuel cell was described, for example, in U.S. Pat. No. 5,559,638, the disclosure of which is incorporated herein by reference.

Regardless of the fuel cell design chosen, the operating efficiency of the device is partly limited by the efficiency of the electrolyte at transporting ions (e.g., protons, oxygen vacancies, hydroxyl ions, bicarbonate ions, etc.). Typically, perfluorinated sulfonic acid polymers, sulfonated hydrocarbon polymers, and composites thereof are used as electrolyte membrane materials for proton conducting fuel cells. However, these conventional materials utilize hydronium ions ($H_3O^+$) to facilitate proton conduction. Accordingly, these materials must be hydrated, and a loss of water immediately results in degradation of the conductivity of the electrolyte and therefore the efficiency of the fuel cell.

As a result, fuel cells utilizing these materials require peripheral systems to regulate water evaporation rates. If water is flushed from the system too quickly, the system will dry out, and the conductivity of the polymer electrolyte will decrease. If water is removed too slowly, liquid water can form and flood the porous volumes within the electrodes, blocking the access of gaseous species. These peripheral systems increase the complexity and cost of these fuel cells, from the use of expensive noble catalysts (Pt) to temperature requirements that cannot exceed much above 100° C. As a result of these temperature limitations, the fuel cell catalysts and other systems cannot be operated to maximum efficiency. Higher temperatures can also reduce carbon monoxide poisoning of the fuel cell catalyst.

It has been shown that the solid acids such as $CsHSO_4$ can be used as the electrolyte in fuel cells operated at temperatures of 140-160° C. (Haile, S. M., et al. *Nature* 2001, 410, 910-913). The high conductivity of $CsHSO_4$ and analogous materials results from a structural phase transition (referred to as a superprotonic phase transition) that occurs at 141° C. from an ordered structure, based on chains of $SO_4$ groups linked by well-defined hydrogen bonds, to a disordered structure in which $SO_4$ groups freely reorient and easily pass protons between one another. Across this transition, the proton conductivity increases by 3 to 4 orders of magnitude from $10^{-6}$ $\Omega^{-1}cm^{-1}$ (phase II) to $10^{-3}$-$10^{-2}$ $\Omega^{-1}cm^{-1}$ (phase I; Baranov, A. I., et al. JETP Lett. 1982, 36(11), 459-462). Thus, disorder in the crystal structure is a key prerequisite for high proton conductivity.

However, the lifetime of these sulfate and selenium based "superprotonic" solid acids is short (Merle, R. B., et al. *Energy & Fuels* 2003, 17, 210-215) when operated under standard fuel cell conditions. The short lifetime of both $CsHSO_4$ and $CsHSeO_4$ under fuel cell operating conditions results from the reduction of sulfur and selenium by hydrogen in the presence of typical fuel cell catalysts, according to:

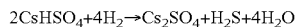

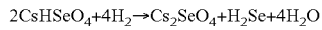

Accordingly, research was done to find a "superprotonic" solid acid electrolyte stable under fuel cell conditions, resulting in the demonstration that $CsH_2PO_4$ (CDP) has as superprotonic transition and is stable under fuel cell conditions (Boysen, D. A., et al. *Science* 2004, 303, 68-70). For $CsH_2PO_4$, the superprotonic transition is at 231° C., above which the material has a high proton conductivity: e.g., $2.5 \times 10^{-2}$ $\Omega^{-1}cm^{-1}$ at 250° C. Solid acid fuel cells (SAFCs) using $CsH_2PO_4$ then operate at intermediate temperatures (~230-280° C.), are inherently impermeable to gases, and transport "bare" protons through a solid electrolyte. These properties give SAFCs advantages over other fuel cell technologies in cost, durability, start/stop cycling, fuel flexibility, and simplified system design. To date, solid acid fuel cells (SAFCs) utilizing this electrolyte as thin (10-25 μm) gas tight electrolyte layers have demonstrated peak power densities of over 330 mW/cm² on hydrogen/air with lifetimes of thousands of hours. Moreover, SAFC stacks have demonstrated robustness to thermal cycling, power outputs of over 1 kW, and degradation rates similar to those of single cells suggesting stack lifetimes in the thousands of hours.

SAFCs have also demonstrated very high tolerances to typical anode catalyst poisons such as carbon monoxide (CO), ammonia ($NH_3$), and hydrogen sulfide ($H_2S$): measured tolerances are 20%, 100 ppm, and 100 ppm, respectively, without significant performance decreases. These high impurity tolerances and the intermediate operating temperatures allow SAFC power systems to operate on reformed fuels with simplified systems. Taken together, the advantageous properties of SAFCs are anticipated to result in relative low SAFC stack and system costs, specifically because of: 1) easy cell and stack fabrication, 2) durable on/off cycling, 3) standard metal and polymer stack components, and 4) simplified systems. SAFCs thus provide the vast majority of the benefits of both high and low temperature systems, but few of their disadvantages. That is, SAFCs operate at high enough temperatures to run effectively on a wide range of reformed fuels, but not so hot that the thermal stability/cost of stack and system components limits commercial viability.

To achieve the high performance and stability of current SAFCs, it was necessary to increase the interaction between the catalyst particles (typically, platinum) used in SAFC electrodes and the solid electrolyte while maintaining reactant gas access, as catalytic reactions only take place on catalyst particles both in contact with the electrolyte and reactant gases. This motivated the development of a deposition method to place the catalyst particles directly on the surface of the solid acid electrolyte. As the electrolyte is water soluble, most common aqueous methods for creating and depositing catalyst particles on substrate materials would not be suitable for use with solid acid electrolytes. Therefore, the simple method described herein for depositing catalyst particles from the gas phase was developed.

This method is applicable to a broad range of chemical and electrochemical devices due to the simple and effective manner in which metal and metal oxide particles can be deposited onto the surfaces of electrodes, high surface area powders, and other porous materials typically used in such devices.

BRIEF SUMMARY OF THE INVENTION

The invention provides a method of preparing metal or metal oxide particles on a substrate. The invention includes forming a reaction mixture of a metal or metal oxide precursor and a substrate; and heating the reaction mixture at reduced pressure, such that metal or metal oxide particles are formed on the substrate.

DETAILED DESCRIPTION OF THE INVENTION

I. General

Figure 1:
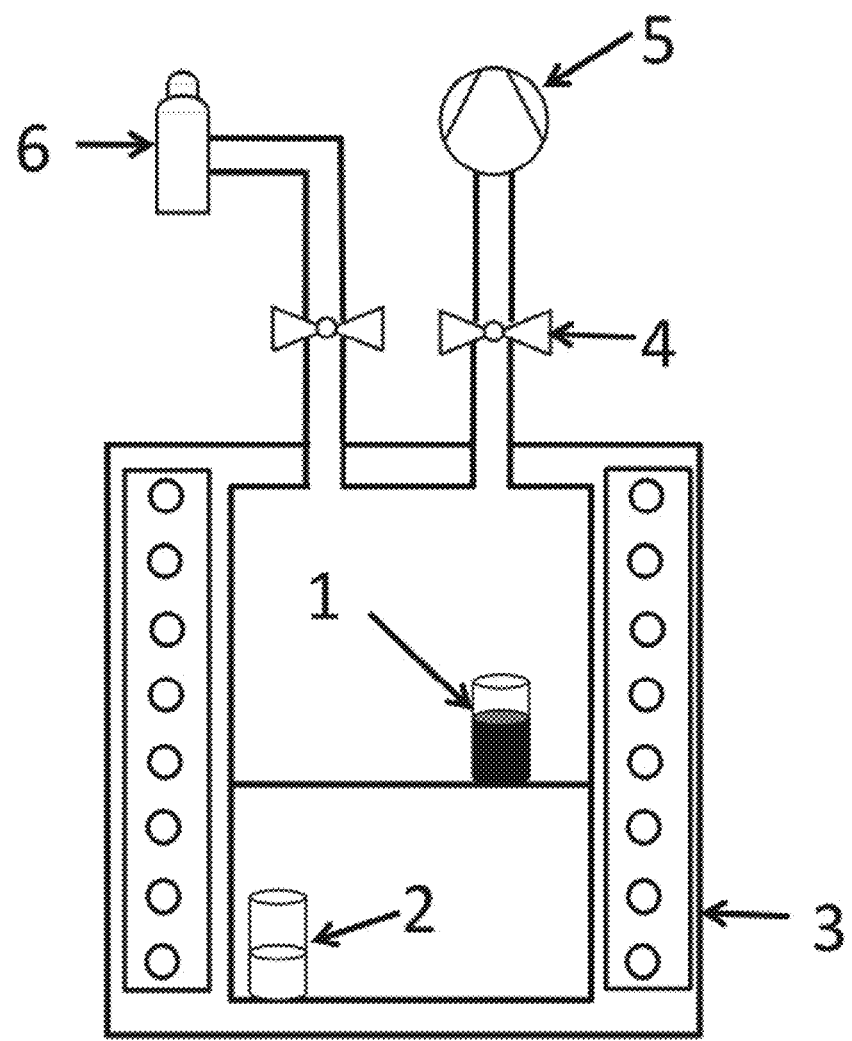
FIG. 1 shows metalorganic vapor deposition method in the case of deposition on a powder substrate. (1) is a container holding the substrate and one or more metalorganic precursors (2) a small volume of liquid water intended to vaporize during the deposition process (3) A sealed vessel containing a heating element (4) valves allowing for evacuation of the vessel (3), closed during deposition. (5) Vacuum pump (6) Inert purge gas
Figure 2:
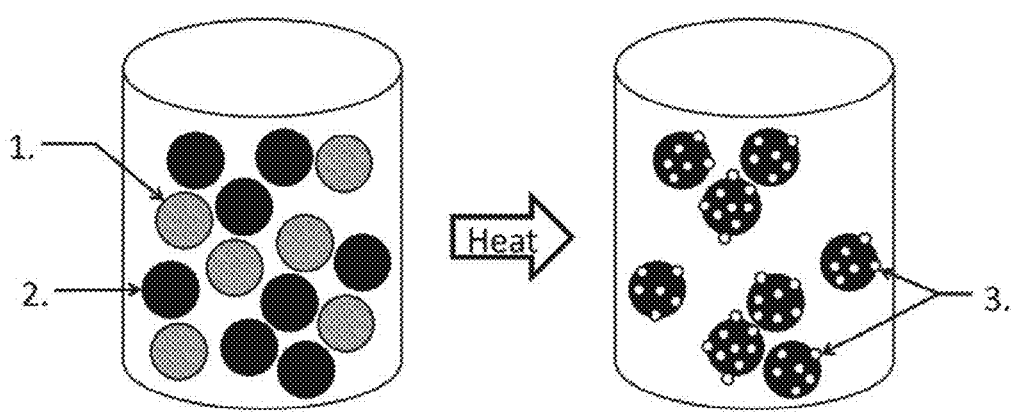
FIG. 2 shows deposition of single-element nanoparticles (3) on powder substrate particles (2) following vaporization and decomposition of solid precursor particles (1).
Figure 3:
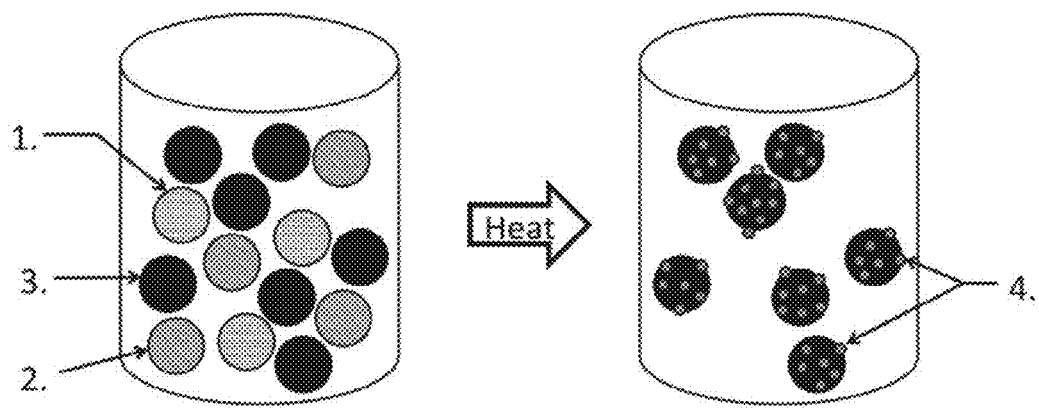
FIG. 3 shows deposition of A-B alloy nanoparticles (4) on powder substrate particles (3) following vaporization and decomposition of solid precursor particles of element A (1) and element B (2).

The present invention provides a method for depositing a metal, a metal alloy, or metal oxide particles on a substrate material using a metal-organic precursor material in the absence of convective flow. Advantages of the method include: a surprisingly uniform coating of substrate materials; an extremely high yield of deposited particles with respect to the precursor metal; a simple and inexpensive apparatus; and low process temperatures in comparison with existing methods. A metalorganic precursor of the material to be deposited is placed in close contact with the substrate and heated in a deposition chamber. The gases in the deposition chamber have a low oxygen partial pressure, and the method can be conducted with a quantity of liquid water which vaporizes during the heating process.

II. Definitions

"Metal or metal oxide particles" refers to particles with average particle size (APS) or diameter in the range of 1-50 nm that are deposited from the vapor phase by the decomposition of precursors on the surface of the substrate material. Particles having a high surface area per unit mass can increase overall chemical or electrochemical reaction rates when employed in a device such as a fuel cell. Such particles can have APSs in the range of 1-10 nm and, preferably, in the range of 1-5 nm.

"Metal or metal oxide precursor" refers to a chemical compound having a metal atom bound by one or more coordinating organic ligands that can dissociate from the metal atom to produce particles of that metal or an oxide of that metal, and form the metal or metal oxide particles of the present invention.

"Metal" refers to elements of the periodic table that are metallic and that can be neutral, or negatively or positively charged as a result of having more or fewer electrons in the valence shell than is present for the neutral metallic element. Metals useful in the present invention include the alkali metals, alkali earth metals, transition metals and post-transition metals. Alkali metals include Li, Na, K, Rb and Cs. Alkaline earth metals include Be, Mg, Ca, Sr and Ba. Transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg and Ac. Post-transition metals include Al, Ga, In, Tl, Ge, Sn, Pb, Sb, Bi, and Po. One of skill in the art will appreciate that the metals described above can each adopt several different oxidation states, all of which are useful in the present invention. In some instances, the most stable oxidation state is formed, but other oxidation states are useful in the present invention.

"Metal oxide" refers to the oxide of any metal such as alkaline earth metals, transition metals, as well as post-transition metals. One of skill in the art will appreciate that other metal oxides are useful in the present invention.

"Metal salt" refers to ionic compounds formed by reaction of a metal with an acid or a base such that an ionic bond is formed between the metal ion and the counterion. Any suitable metal can be used to form the metal salt, as well as any suitable acid or base.

"Substrate" refers to a material upon which the metal or metal oxide particles are formed. Any suitable substrate can be used, including, but not limited to, a metal, metal oxide, metal salt, carbon material, silica material, polymer, solid acid or solid oxide.

"Carbon material" refers to any solid material containing allotropic forms of carbon, including crystalline and amorphous phases, and mixtures of these phases in composites or solid solutions with other solid materials.

"Silica material" refers to any solid material containing allotropic forms of silicon dioxide ($SiO_2$), including crystalline and amorphous phases, and mixtures of these phases in composites or solid solutions with other solid materials.

"Polymeric material" refers to a high-weight, macromolecular solid material components characterized by at least twenty, and preferably more, repeating low-molecular-weight monomer units.

"Solid acid" refers to compounds with the chemical formula $M_aH_b(XO_c)_d \cdot nH_2O$, wherein M is a metal cation having charge from +1 to +2, and X is one or more species selected from Si, P, S, As, Se, Te, Cr, and Mn. Subscripts a, b, c, d, and n are rational numbers. In some embodiments, M includes one or more species selected from Li, Be, Na, Mg, K, Ca, Rb, Sr, Cs, Ba, Ti, and $NH_4$.

"Solid oxide" refers to materials suitable in a solid oxide fuel cell, such as yttria stabilized zirconia (YSZ), scandia stabilized zirconia (ScSZ) and gadolinium doped ceria (GDC). Other solid oxides are useful in the methods of the present invention.

The substrate can also be in any suitable form, such as a solid, a porous solid or a powder. "Powder" refers to a finely divided solid material with average particle sizes ranging from tens of nanometers to hundreds of microns. "Porous solid" refers to any solid material composed of a nonzero volume fraction of void space. "Solid substrate" refers to a solid material that is substantially free of void space.

"Forming a reaction mixture" refers to the process of bringing into contact at least two distinct species such that they mix together and can react, either modifying one of the initial reactants or forming a third, distinct, species, a product. It should be appreciated, however, the resulting reaction product can be produced directly from a reaction between the added reagents or from an intermediate from one or more of the added reagents which can be produced in the reaction mixture.

"Reduced pressure" refers to a pressure less than atmospheric pressure.

"Water soluble" refers to the characteristic ability of a compound or composition to dissolve in water.

"Continuous network" refers to a structure of arbitrary fractal dimension, composed of adjacent sites occupied by active elements such that an unbroken percolation path defined by active element sites exists between the boundaries of the structure. The continuous network can be a continuous, electrically conductive network defined by an active element with the property of electrical conductivity.

"Solvent" refers to water-miscible or -immiscible solvents capable of dissolving either or both of water-soluble and water-insoluble compounds. Exemplary solvents useful in the present invention include, but are not limited to, alcohols, acids, polyols and other water-miscible organic solvents such as propylene carbonate, N-methyl pyrrolidone, di-methyl sulfoxide and di-methyl formamide. Other useful solvents include halogenated solvents such as dichloromethane, chloroform and carbon tetrachloride. One of skill in the art will appreciate that other organic solvents are useful in the present invention.

III. Preparation of Metal or Metal Oxide Particles on a Substrate

The present invention provides methods for producing metal, metal alloy, or metal oxide particles from metal-organic precursor materials in the absence of convective flow. Particles are formed from precursors in the vapor phase on a substrate material in high yield, affording uniformly-coated substrates using low process temperatures.

Accordingly, the invention provides a method of preparing metal or metal oxide particles on a substrate. The method includes forming a reaction mixture of a metal or metal oxide precursor and a substrate, and heating the reaction mixture at reduced pressure, such that metal or metal oxide particles are formed on the substrate.

Precursors

In general, the metal or metal oxide precursors used in the methods of the invention are metal-organic species containing a metal atom bound by one or more coordinating ligands. In some embodiments, the metal or metal oxide precursor includes at least one metal selected from a transition metal and a post-transition metal. In some embodiments, the metal or metal oxide precursor includes at least one metal selected from Pt, Pd, Ir, Ru, Ni, Co, Fe, Cu, V, Cr, Ti, Ta, Mn, Mo, Nb, and Sn. In some embodiments, the metal or metal oxide precursor includes at least one metal selected from Pt, Pd and Ru. In some embodiments, the metal or metal oxide precursor includes Pt. In some embodiments, the metal or metal oxide precursor includes Pt and Pd. One of skill in the art will appreciate that other combinations of metals can be useful as metal or metal oxide precursors in the methods of the invention.

More than one precursor can be used simultaneously in the method to produce nanoparticles or a nanoparticle film or network that is composed of more than one metal, alloy, intermetallic compound, or metal oxide. This can be accomplished by addition of both precursors into direct contact with the substrate prior to heat treatment in low oxygen partial pressure. In the case of mixed precursors, both precursors can vaporize and deposit atoms, clusters, or particles concurrently on the substrate, forming solid solution nanoparticles or multiphase particles depending on the relative volatility of the precursors and the intrinsic mixing thermodynamics of the deposited species. Metals for which this approach is applicable include Pt, Pd, Ir, Ru, Rh, Ni, Co, Fe, Cu, V, Cr, Ti, Ta, Mn, Mo, Nb, and Sn, among others.

Any suitable metal-organic precursor can be used in the methods of the invention. Suitable ligands for the metal-organic precursor include, but are not limited to, acetylacetonate and fluoroacetylacetonates such as trifluoroacetylacetonate and hexafluoroacetylacetonate. In some embodiments, the precursor includes platinum (II) acetylacetonate. In some embodiments, the precursor includes platinum (II) acetylacetonate and palladium (II) acetylacetonate.

Substrates

The precursor deposition process of the invention is broadly applicable to a wide range of substrates. In some embodiments, the substrate includes at least one member selected from a metal, a carbon material, a metal oxide, a silica material, a polymeric material, a solid acid, a solid oxide, and a metal salt.

Nearly all oxides collect water, hydroxyl groups, or both, and metals typically exhibit passive oxide films that are similarly hydroxylated. Without wishing to be bound by any particular theory, it is believed that hydroxyl groups on a substrate surface displace organic ligands from a metal-organic precursor and promote the particle formation process. For this reason, materials with surface hydroxyl groups—including metals and metal oxides, as well as metal salts, carbon materials, silica materials, and polymers—can be useful substrates in the present invention. In some embodiments, the substrate is selected from Fe and its alloys, including stainless steel. In some embodiments, the substrate is selected from Ni, Al, Sn, Zn, Ag, Ta, Ru, Zr, Ti, Co, Cu, Zn, Mn, Au, Pd, and Pt, or from alloys oxides thereof.

Metals useful as substrates in the methods of the invention include Al, Cd, Ca, Ce, Cr, Co, Cu, Gd, Ga, Au, In, Ir, La, Pb, Li, Mg, Mn, Mo, Nd, Ni, Pd, Pt, Rh, Ru, Sm, Ag, Sr, Ta, Sn, Ti, V, Y, Zn, and Zr. In some embodiments, the metal substrate can be Al, Ce, Cr, Co, Cu, Au, In, Ir, Pb, Li, Mg, Mn, Mo, Nd, Ni, Pd, Pt, Rh, Ru, Ag, Sr, Ta, Sn, Ti, V, Y, Zn, or Zr. In other embodiments, the metal substrate can be Pt, Pd, Ir, Ru, Rh, Ni, Co, Fe, Cu, V, Cr, Ti, Ta, Mn, Mo, Nb, or Sn. Metal oxides useful as substrates in the methods of the invention include oxides of Al, Cd, Ca, Ce, Cr, Co, Cu, Gd, Ga, Au, In, Ir, La, Pb, Li, Mg, Mn, Mo, Nd, Ni, Rh, Ru, Sm, Ag, Sr, Ta, Sn, Ti, V, Y, Zn, and Zr.

In some embodiments, the substrate can be a pure or mixed oxide of silicon. Silicon can be present in various allotropic forms, including quartz, fused quartz, other silicate glasses, fumed silica, and mesoporous silicas such as MCM-41. In some embodiments, the substrate can be titanium dioxide, in the anatase phase, rutile phase, or mixtures thereof. Titanium dioxide can be doped with other elements such as nitrogen to enhance electronic conductivity and catalytic interactions with the deposited metal or metal oxide particles. In some embodiments, the substrate can be pure or mixed oxides of aluminum, such as sapphire, nanoparticulate aluminum oxide, or porous monoliths of anodic aluminum oxide.

In some embodiments, the substrate can be carbon in various allotropic forms such as diamond, graphite, graphene, graphene oxide, nanotubes, Bucky balls, and turbostratically disordered carbon blacks (including acetylene black and Vulcan XC-72). In some embodiments, the substrate can be a polymer, such as polybenzimidazole and other imidazole-based polymers, or perfluorinated sulfonic acid polymers such as Nafion.

In some embodiments, the substrate includes a solid acid. Examples of solid acids include, but are not limited to, $Cs_5(HSO_4)_3(H_2PO_4)_2$, $Cs_3(HSO_4)_2(H_{1.5}(S_{0.5}P_{0.5})O_4)$, $Cs_5H_3(SO_4)_4 \cdot xH_2O$, $TlHSO_4$, $CsH(SeO_4)_4$, $Cs_2(HSeO_4)(H_2PO_4)$, $(NH_4)_3H(SO_4)_2$, $(NH_4)_2(HSO_4)(H_2PO_4)$, $Rb_3H(SO_4)_2$, $Rb_3H(SeO4)_2$, $Cs_{1.5}Li_{1.5}H(SO_4)_2$, $Cs_2Na(HSO_4)_3$, $TlH_3(SeO_3)_2$, $CsH_2AsO_4$, $(NH_4)_2(HSO_4)(H_2AsO_4)$, $CaNaHSiO_4$, $Cs_2(HSO_4)(H_2PO_4)$, $CsHSO_4$ and $CsH_2PO_4$. Hydrates of solid acids, containing varying amounts of water, can also be used as substrates in the present invention. $CsH_2PO_4$, in particular, can be used a substrate in various forms. Given a solid $CsH_2PO_4$ monolith as the substrate, a precursor can be applied as a solid powder, slurry or suspension, or from solution onto the membrane and subjected to the appropriate temperature and partial pressure conditions to deposit nanoparticles or a nanoparticle film on the surface of the $CsH_2PO_4$ monolith for use as a planar electrode in a fuel cell or similar device. The process can be performed when $CsH_2PO_4$ is mixed with other materials, such as metals, oxides, carbides, polymers, carbon materials, and silica materials, to form dense composites.

The methods of the invention are also applicable to the deposition of nanoparticles or a nanoparticle film or network on fine powders of $CsH_2PO_4$ with APS from 10 nm to 100 micron. Similarly it can be applied to a powdered mixture of $CsH_2PO_4$ and other solid materials as described above, resulting in deposition of nanoparticles or a nanoparticle film or network on both the $CsH_2PO_4$ and the added solid materials simultaneously.

The method is also applicable to the deposition of nanoparticles or a nanoparticle film or network in a porous solid composed of $CsH_2PO_4$. Porous $CsH_2PO_4$ can be fabricated by pressing powders with a particular APS (generally 10 nm-100 μm) in a uniaxial die at a suitably low pressures. At sufficiently low pressures, the compact does not become fully dense but rather retains an open-cell porosity with pore sizes on the order of the starting powder APS. Pore density can be controlled by the pressure applied in the die. Nanoparticles or a nanoparticle film or network can then be deposited within the porous $CsH_2PO_4$ solid. Porous solids composed of $CsH_2PO_4$ and additional components, such as metals, oxides, carbides, polymers, carbon materials, and silica materials, can also be fabricated in this manner.

Any suitable combination of precursor and substrate can be used in the methods of the invention. In some embodiments, the substrate includes at least one of $CsH_2PO_4$ and alumina. In some embodiments, the substrate includes $CsH_2PO_4$. In some embodiments, the metal or metal oxide precursor includes Pt, and the substrate includes $CsH_2PO_4$.

The substrate can be in any suitable physical form. For example, the substrate can be a solid block with a minimum of porosity. Alternatively, the substrate can be a solid with a substantial amount of porosity. Moreover, the substrate can be a powder. In some embodiments, the substrate can be a powder, a porous substrate or a solid substrate. In some embodiments, the substrate can be a porous substrate or a solid substrate, such that the metal or metal oxide nanoparticles form a continuous network of particles on the surface of the substrate. In some embodiments, the precursor can be platinum (II) acetylacetonate and the substrate can be $CsH_2PO_4$. In some embodiments, the metal precursor includes platinum (II) acetylacetonate and palladium (II) acetylacetonate, and the substrate can be $CsH_2PO_4$. One of skill in the art will appreciate that other combinations of precursors and substrates can be useful in the methods of the invention.

Processing Conditions

The methods of the invention afford particle-coated substrates using advantageous processing conditions, including relatively low temperatures and moderate pressures, where both the metal or metal oxide precursor and the substrate are in the same reaction vessel. In some embodiments, the methods of the invention include contacting a metal or metal oxide precursor and a substrate at low oxygen partial pressure; heating the metal or metal oxide precursor under conditions sufficient to vaporize the precursor; and collecting the gaseous metal or metal oxide precursor on the substrate under conditions sufficient to form metal or metal oxide particles, thereby depositing the particles on the substrate.

In the methods of the invention, metal or metal oxide precursors and substrate materials can be placed in direct physical contact in a suitable container. In some embodiments, the metal or metal oxide precursor and the substrate are in direct physical contact. Containers useful in the invention include evacuable vessels made of glass, metal, metal oxide, polymer, or combinations of these materials. In some embodiments, the container can be a glass, metal, metal oxide, or polymeric cylinder or prism capable of being evacuated by a vacuum pump. In still other embodiments, the container is an insulated vacuum oven such as the Fisher Scientific Isotemp 281A Vacuum Oven.

Precursors can be applied to the substrate in various forms. Some embodiments of the invention provide methods as described above, wherein the reaction mixture contains a precursor and a substrate without solvent. Alternatively, the precursor or precursors can be applied to a substrate as a slurry, suspension, or solution in a suitable solvent. Accordingly, some embodiments of the invention provide methods wherein the reaction mixture includes a solvent selected from dichloromethane, chloroform and carbon tetrachloride. One of skill in the art will appreciate that other solvents can be useful in the methods of the invention, depending on the nature of a particular precursor or substrate.

Figure 14:
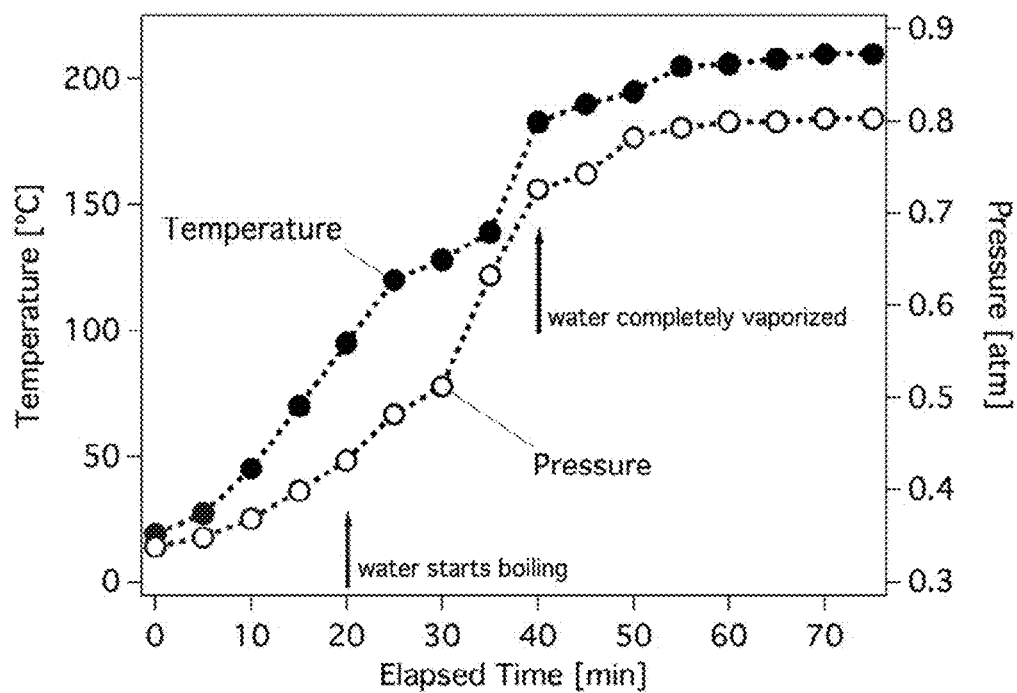
FIG. 14 shows temperature and pressure profiles of a container during deposition of Pt on $CsH_2PO_4$ from $Pt(acac)_2$.

In general, the methods of the invention are conducted using a temperature program that: (a) heats from room temperature to the ultimate temperature; (b) reaches a value high enough to cause the vaporization of the metal or metal oxide precursor; and (c) is low enough that direct thermolysis of the metal or metal oxide precursor is not the dominant decomposition mode. Some embodiments of the invention provide a method of preparing metal or metal oxide particles on a substrate as described above, wherein heating the reaction mixture is conducted at a temperature of from about 20 to about 500° C. The heating can be a temperature of, for example, from about 20 to about 500° C., or from about 20 to about 450° C., or from about 20 to about 300° C., or from about 20 to about 250° C. The heating can be to a temperature of about 100° C., 110° C., 120° C., 130° C., 140° C., 150° C., 160° C., 170° C., 180° C., 190° C., 200° C., 210° C., 220° C., 230° C., 240° C., or about 250° C. In some embodiments, the heating is at a temperature of from about 20 to about 300° C. In some embodiments, the heating is at a temperature of from about 20 to about 210° C. One of skill in the art will appreciate that the heating temperature will vary, depending in part on the precursor or precursors employed in the method. For $Pt(acac)_2$, for example, the final temperature in the heating program is generally greater than 120° C. and lower than 300° C. The temperature and pressure profile of the process used to produce Pt metal nanoparticles on $CsH_2PO_4$ from $Pt(acac)2$ precursor is shown in FIG. 14.

The method functions in a temperature regime that is above the volatilization temperature of the precursors, but below the thermolysis temperature. As such, ligand dissociation from the metal-organic precursors to produce the desire particles must be accomplished by a route other than thermal decomposition. Without wishing to be bound by any particular theory, it is believed that precursor decomposition occurs in the methods of the invention via interaction of surface water species such as $H_3O^+$, $H_2O_2$, $H_2O$, and $OH^-$ with the precursor ligands. This is believed to result in chemical reactions that deposit the desired material on the surface. Accordingly, the methods of the invention can include heating the reaction mixture in an atmosphere containing water vapor (or other gas-phase solvents) that can modulate particle properties including, but not limited to, particle microstructure. In some embodiments, the heating is performed in the presence of water vapor.

Any suitable pressure can be used in the methods of the invention. In general, heating of the reaction mixture is conducted at a pressure of from about 0.01 to about 1 atm. The heating can be performed at a pressure of, for example, from about 0.01 to about 1 atm, or from about 0.02 to about 0.9 atm, or from about 0.25 to about 0.75 atm. The heating can be performed at a pressure of about 0.01 atm, 0.05, 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, or 1 atm. Some embodiments of the present invention provide methods as described above, wherein one or more precursor and one or more substrate materials are placed in direct physical contact in a sealed container at lower than atmospheric pressure and low oxygen partial pressures. In some embodiments, the heating is performed at a pressure of from about 0.01 to about 1 atm. In some embodiments, the heating is performed at a pressure of from about 0.2 to about 0.9 atm. In some embodiments, the heating is performed at a pressure of from about 0.1 bar to about 0.9 bar.

"Low oxygen partial pressure" refers to a condition in a gas mixture such that the ratio of the number of moles of oxygen to the number of total moles of gas is lower than 0.1%. Oxygen partial pressures useful in the invention are from about 0 bar to about 0.03 bar. The oxygen partial pressure can be, for example, from about 0.01 bar to about 0.03 bar, or from about 0.015 bar to about 0.02 bar. In some embodiments, the oxygen partial pressure can be about 0 bar, or about 0.005 bar, or about 0.01 bar, or about 0.015 bar, or about 0.02 bar, or about 0.025 bar, or about 0.03 bar.

Using the conditions described above, the present invention provides platinum nanoparticles on $CsH_2PO_4$ (CDP) powder, platinum on a porous disc of CDP, a mixture of platinum and palladium nanoparticles on CDP powder, platinum nanoparticles on alumina, and ruthenium oxide on carbon black.

Use of Particle-Coated Substrates

Substrates modified with nanoparticles, nanoparticle networks, or nanoparticle films can be used in electrochemical devices such as membrane reactors, batteries, supercapacitors, electrolyzers, and hydrogen pumps. Hydrous ruthenium oxide supported on high surface area carbon black, for example, can be used as the active material in an electrochemical supercapacitor. The decorated particles can be formed into a composite electrode with various active and inactive materials, as in the case of a polymer electrolyte membrane electrolyzer, where iridium oxide supported on carbon black is mixed in an ink with a proton-conducting polymer suspension, and painted or sprayed on a fibrous carbon gas diffusion medium for use as an electrode.

Particle-modified substrates can also be used in chemical devices such as fuel reformers or catalytic reactors. For example, cobalt supported on various oxides is useful for Fischer-Tropsch syntheses. Palladium supported on oxides such as $SiO_2$, $Al_2O_3$, or $TiO_2$ can be used for CO oxidation devices. Palladium supported on ZnO can be used as a steam reforming catalyst in a reforming device used to produce hydrogen via catalytic decomposition of hydrocarbons. Particle-modified substrates can also be used in photochemical devices such as photo-assisted chemical reactors or photoelectric solar cells. Platinum nanoparticles supported on ZnO or $TiO_2$, for example, can be used for charge separation in a solar cell.

Substrates modified with nanoparticles, nanoparticle networks, or nanoparticle films can be used in fuel cells. Pt supported on various forms of carbon, including graphite, graphene, and carbon black can be formed into a composite electrode with various active and inactive materials, as in the case of a polymer electrolyte membrane fuel cell, in which the decorated particles are mixed in an ink with a proton-conducting polymer suspension, and painted or sprayed on a fibrous carbon gas diffusion medium for use as an electrode. In another use of the method, electrocatalyst particles can be deposited directly on the woven or non-woven fibrous gas diffusion medium for use in a fuel cell.

The methods of the invention afford materials that can be used in any of the applications described above. The materials can be used for electrochemical reactions involving one or more electrons as a reactant. In electrochemical devices and reactors, electron transfers happen at a surface and require connection to an external or internal circuit to transport electrons to and from the reaction site. Therefore, suitable materials for electrochemical reactions are generally characterized by electrical conductivity and a high surface area. The methods of the present invention can be used to deposit dispersed, high surface area catalysts for electrochemical reactions ("electrocatalysts") on electrically conductive substrates such as nano-sized platinum dispersed on carbon black. Electrically conductive substrates such as metals, carbon, metal carbides, that act as supports for metallic, alloy, and oxide nanoparticles of metals such as Pt, Pd, Co, Ir, Rh, Ru, and Ni can be used for electrochemical reactions converting one chemical species to another.

The method can also be used to synthesize catalysts for chemical reactions that do not explicitly require electrons as reactants. In this case, electrical conductivity is not necessarily required, but a high surface area remains particularly useful. Substrates such as nanoparticles of aluminum oxide, silicon oxide, or titanium oxide, supporting metallic, alloy, and oxide nanoparticles of metals such as Pt, Pd, Co, Ir, Rh, Ru, and Ni can be used for chemical reactions converting one chemical species to another.

These materials can be synthesized by mechanical mixing or agitation of the substrate (in particle or fiber form) with the appropriate precursor or precursors in a vessel made of glass, polymer, metal or composite of suitable size to bring all the added components into close contact, as in a compact or pile. In the case of a monolithic porous substrate, a woven fibrous substrate, or any other substrate with a defined macroscopic structure that is to be maintained, the precursor or precursor can be formed in a compact in contact with the substrate. After this compact is formed, deposition of the metal, alloy, or oxide particles proceeds at low oxygen partial pressure and elevated temperature as specified.

As described above, it can be desirable for the nanoparticles deposited on a substrate to form a continuous network (i.e., a particle structure of arbitrary fractal dimension, composed of adjacent particles) or film (i.e., a two-dimensional or quasi-two-dimensional layer). In such materials, electrons or ions can be conducted through the film or network in an unbroken path from one boundary of the substrate to another, or from one boundary of a composite material containing the substrate to another boundary. Examples of such materials include platinum deposited in a continuous nanoparticle film on $CsH_2PO_4$ used in solid acid fuel cells. $CsH_2PO_4$ is not electrically conductive, but a continuous film of Pt can be formed on the surface of $CsH_2PO_4$ (see FIG. 4) to act as both an electro catalyst and an electronic conductor, allowing an unbroken electrical circuit to be formed. The materials can also be used in a battery intercalation reaction, in which an ion is stored in the crystal lattice of a host material, or in an electrochemical capacitor, where charge is stored by changing the oxidation state of a metal or oxide particle.

Figure 10:
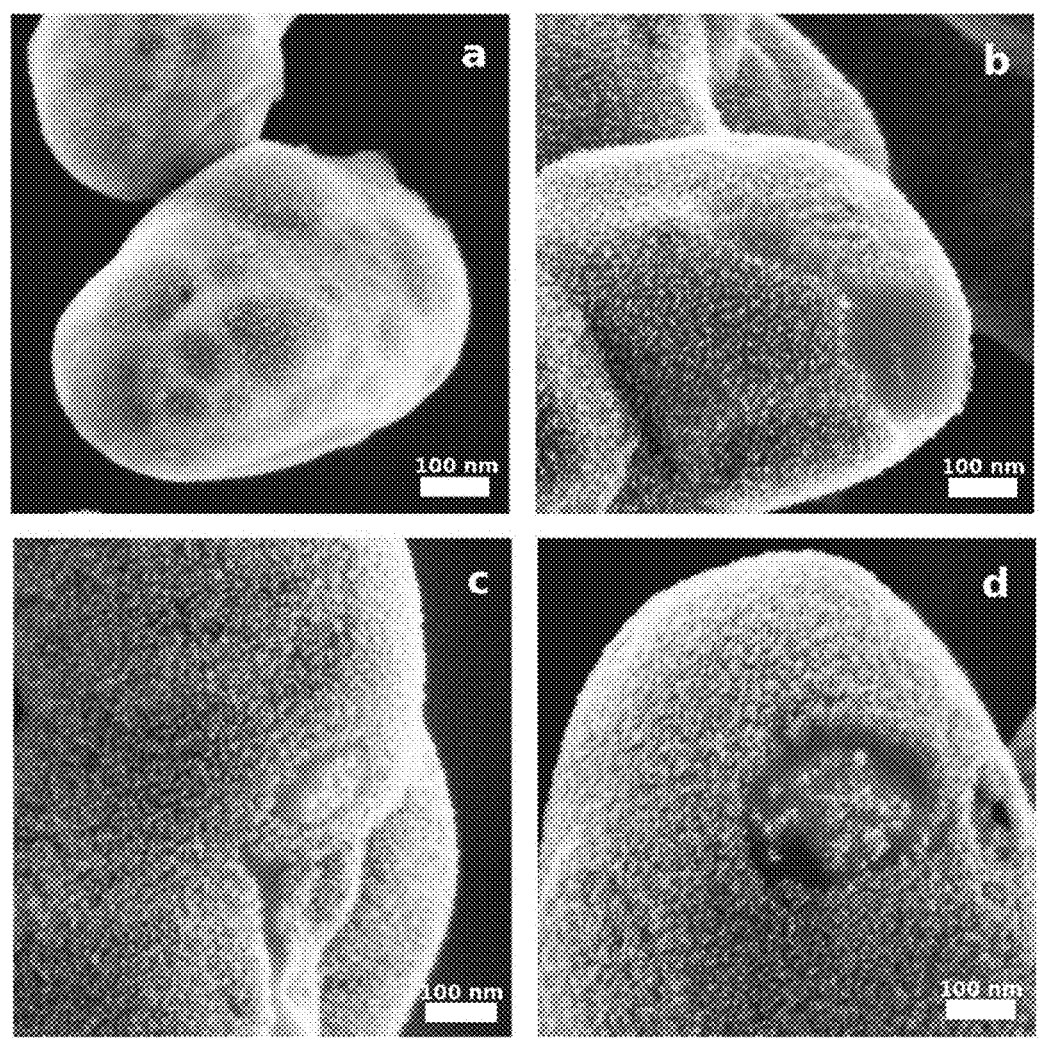
FIG. 10 shows scanning electron micrographs of Pt nanoparticles deposited on $CsH_2PO_4$. (a) 5 wt % Pt (b) 9 wt % Pt (c) 17 wt % Pt (d) 29 wt % Pt.

When synthesizing materials of this type, it is useful to know the surface area of the substrate in order to effectively form a continuous film or network on the substrate surface. Properly scaling the amount of precursor used in the method to the surface area of the substrate can help to control the size of the resulting particles and form a percolating network or film. In the case of Pt supported on $CsH_2PO_4$ as shown in FIG. 10, for example, 5 wt % Pt is not sufficient to produce a percolating electronic network on CDP particles with average particle size around one micron (or surface area around 2.5 $m^2/g$).

Another use of continuous networks or films is the synthesis of nanostructures based on porous templates. A metal, alloy or oxide film can be coated on the internal structure of a porous material and the material removed via means such as dissolution, liberating a structure composed entirely of the deposited material with a shape dictated by the porous template. Yet another use of continuous networks or films are as protective coatings, such as against chemical attack, or frictional wear.

The methods of the invention can be used to prepare materials for solid acid fuel cells, as described above. The functioning of a fuel cell device is determined in part by the structure of its electrodes. A fuel cell electrolyte is a solid capable of conducting ions between conjugate fuel cell electrodes or within a fuel cell electrode during the process of a fuel cell reaction or half-reaction, allowing chemical interactions between the electrodes or within a single electrode. Fuel cell electrodes can be formed from materials including catalyst supports, electrolytes, polymers, gas diffusion media, and current collectors.

The electrochemical reactions that define a fuel cell occur at so-called tri-phase or triple-phase boundaries, which are zones characterized by an interface of a catalyst, electrolyte, and gas such that all phases form continuous networks. The methods of the invention can be used to deposit nanoparticle networks on or within these electrolyte phases in service of creating such networks in a fuel cell. This approach is applicable to solid oxide materials such as cerium oxide, lanthanum strontium manganite, lanthanum strontium cobalt ferrite, and yttria-stabilized zirconia. In other embodiments, this method can be applied to solid electrolytes (i.e., an ion conductor that does not contain a liquid phase) such as sulfated zirconia, or anhydrous doped or undoped tin pyrophosphates. In still other embodiments this method can be applied to polymer electrolytes, such as alkaline exchange polymers, sulfonated hydrocarbons or perfluorinated sulfonic acid polymers such as Aquivion, the 3M ionomer, or Nafion.

IV. Examples

Characterization

Samples of each electrode powder were analyzed by scanning electron microscopy (SEM), energy dispersive spectrometry (EDS), x-ray photoelectron spectroscopy (XPS), and x-ray diffraction (XRD).

SEM and EDS analyses were performed with a LEO 1525 FESEM system. Images were acquired at an accelerating voltage of 3 kV with the in-lens electron detector, and EDS spectra were acquired at 15 kV with an Oxford INCA detector. Separate CDP-precursor mixtures were also prepared according to the procedure above, and micrographs were recorded at 10 kV to characterize the mixing and contact of CDP and $Pt(acac)_2$.

XPS experiments were carried out in an Omicron ultra high vacuum (UHV) chamber with a base pressure better than $5\times10^{-11}$ mbar. The chamber was equipped with a PHI Al Kα X-ray source (10-610E) and monochromator (10-420), and an Omicron electron energy analyzer (EA-125). The samples were affixed to Si crystals (Ted Pella) with a uniaxial pressure of 100 MPa. Before the measurement, the samples were outgassed at approximately 100° C. using an indirect heater located underneath the sample holder. In addition to survey scans spanning a wide binding energy range with 0.5 eV step size, high-resolution spectra were recorded with smaller step size for the Pt 4d (0.2 eV), P 2p (0.1 eV), C 1s (0.2 eV), and O 1s (0.1 eV) photoelectron peaks. Adventitious carbon was used to calibrate the binding energy shifts of the sample (C 1s=284.8 eV). [Moulder, F.; Stickle, W.; Solbol, P.; Bomben, K. *Handbook of X-ray Photoelectron Spectroscopy*; Perkin-Elmer Corp., 1992] Peak fitting was performed with the XPSPeak [) Kwok, R. W. M. XPSPeak, 1999] software.

XRD was conducted on the as-synthesized samples with a Philips X'Pert x-ray diffractometer using Cu Kα radiation ($\lambda$=0.15418 nm, 45 kV, 40 mA, 0.05° step, 4.0 s/step). We also examined the solid remnants of powders that had been washed in deionized water several times to dissolve the CDP and leave the deposited metal particles intact, obtaining diffraction patterns absent of the strong CDP peaks. Rietveld refinement was performed on these patterns using the Philips X'Pert Plus software. [Philips Analytical B.V., Philips X'Pert Plus, 1999]

Preparation of CDP (Powder)

Coarse-grained $CsH_2PO_4$ powder was synthesized as described previously. [Boysen, D.; Uda, T.; Chisholm, C.; Haile, S. Science 2004, 303, 68] $Cs_2CO_3$ (Alfa Aesar, 99.9%) and $H_3PO_4$ (ACS, 85% w/w aqueous solution) were combined in a molar ratio of 1:2 in aqueous solution and subsequently precipitated in methanol, followed by drying of the collected solid in air at 120° C. The coarse powder was tumbled in a low-energy ball mill with 2 mm diameter $ZrO_2$ spherical milling media in methanol for 15 hours. The milled powder was recovered by filtration through a 270-mesh stainless steel screen and washing of the milling media with copious methanol. After allowing the slurry to settle for 24 hours, the supernatant methanol was poured off and replaced with toluene. This slurry was also allowed to settle and the toluene was removed by boiling at 120° C. overnight. The fine CDP powder that resulted from this treatment had an average particle size of ~1 μm and a Brunauer-Emmett-Teller (BET) specific surface area of 2.4 $m^2/g$ measured by nitrogen adsorption with a Micromeritics Gemini VI 2390 surface area analyzer.

Example 1. Platinum on CDP (Powder)

A borosilicate glass vial was filled with 80 mg of platinum (II)(2,4)pentanedionate (also known as Platinum acetylacetonate, $Pt(acac)_2$ and 200 mg of $CsH_2PO_4$ (CDP) powder. The sample vial was capped and shaken vigorously by hand until the powder mixture appeared to be a uniform, pale yellow color. The cap of the vial was removed and the vial transferred to a vacuum oven. A separate 3.7-mL vial was then filled with 2.1 mL of deionized water and placed in the oven far from the vial containing the powder mixture. The oven was evacuated to 0.17 bar with a rotary vane vacuum pump and purged with dry $N_2$ three times. The oven was then evacuated again to 0.30 bar, and all valves were sealed. The thermostat was set to 210° C. and heating was started immediately, reaching equilibrium after approximately 75 min at a temperature of 210° C. and a total pressure of 0.8 bar. After 15 h at 210° C., the heater was shut off, the water vapor was evacuated, and the oven was allowed to reach room temperature. This treatment deposited 16.1 wt % Pt nanoparticles on the surface of the CDP substrate.

Example 2. Platinum on CDP (Porous Disc)

Figure 4:
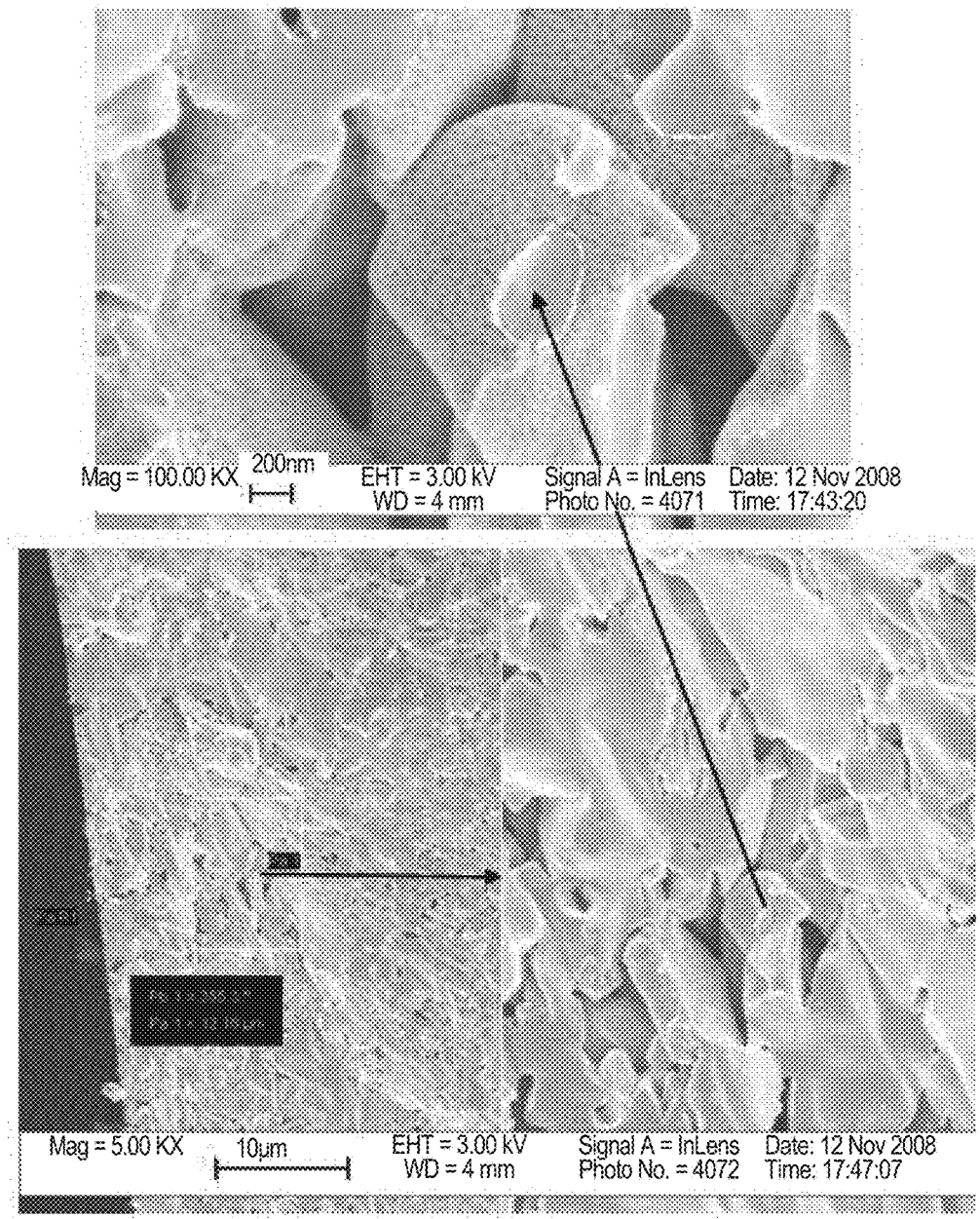
FIG. 4 shows scanning electron micrographs of Pt nanoparticles formed within the pores of a porous disc of $CsH_2PO_4$ after processing as described in Example 2.

100 mg of $Pt(acac)_2$ was applied in powder form to the top surface of a porous disc composed of 500 mg $CsH_2PO_4$ 0.75 inches in diameter, formed by compression of $CsH_2PO_4$ powder at 8 MPa. Metal deposition on $CsH_2PO_4$ proceeded at 210° C. in a N2/water vapor atmosphere via a protocol identical to the procedure in Example 1. This treatment deposited a continuous, electrically conductive film of Pt nanoparticles on the surface and within the pore structure of the $CsH_2PO_4$ substrate. A total of 22 mg of Pt was deposited. Scanning electron micrograph of Pt nanoparticles after processing is shown in FIG. 4.

Example 3. Platinum/Palladium Alloy on CDP (Powder)

A glass shell vials was filled with 300 mg of $CsH_2PO_4$, 47.5 mg $Pt(acac)_2$ and 147.5 mg $Pd(acac)_2$. Gentle shaking was used to mix the $CsH_2PO_4$ and Pt and Pd precursors in the vial. Metal deposition on $CsH_2PO_4$ proceeded at 210° C. in a N2/water vapor atmosphere via a protocol identical to the procedure in Example 1. This treatment deposited 20 wt % $Pt_{20}Pd_{80}$ alloy nanoparticles on the surface of the $CsH_2PO_4$ substrate.

Figure 5:
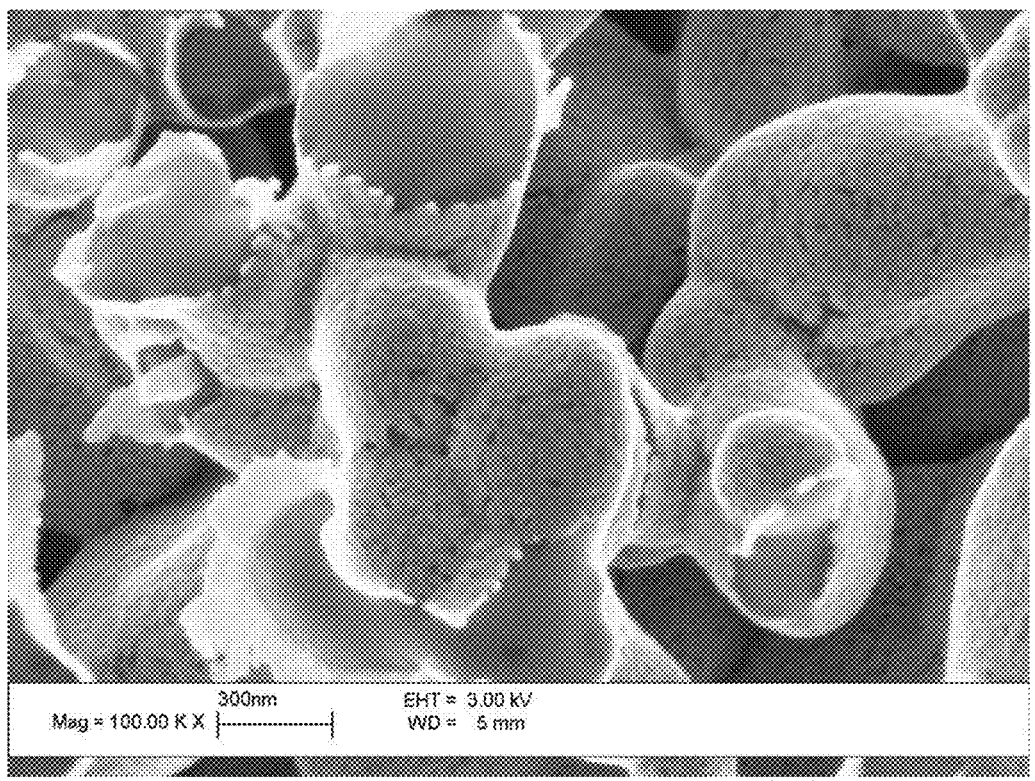
FIG. 5 shows scanning electron micrograph of Pt—Pd alloy deposited on $CsH_2PO_4$ via method similar to that described in Example 3.
Figure 6:
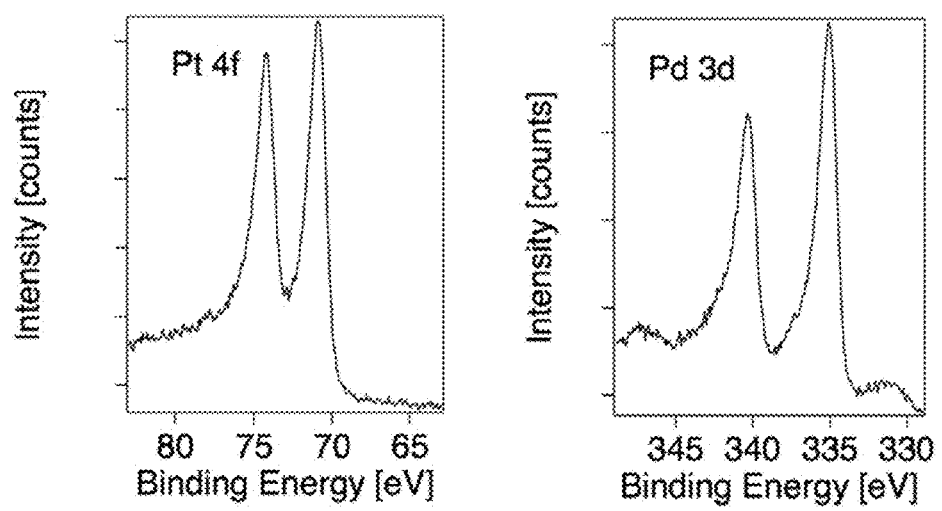
FIG. 6 shows Pt 4f and Pd3d XPS spectra for $Pd_{80}Pt_{20}$ nanoparticles formed on the surface of $CsH_2PO_4$ particles after processing similar to that described in Example 3. Samples were washed in water to remove $CsH_2PO_4$ particles and leave only Pt—Pd nanoparticles.
Figure 7:
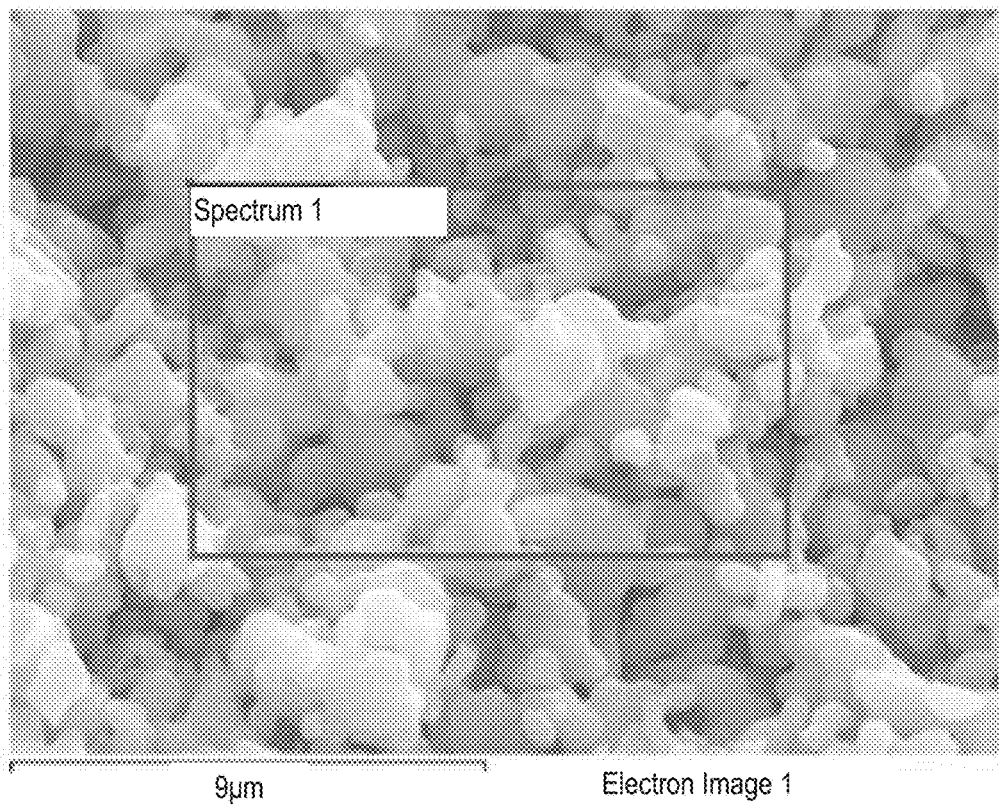
FIG. 7 shows a scanning electron micrograph (top) and associated EDS spectrum (bottom) of Pt—Pd alloy deposited on $CsH_2PO_4$ via a method similar to that described in Example 3.
Figure 7:
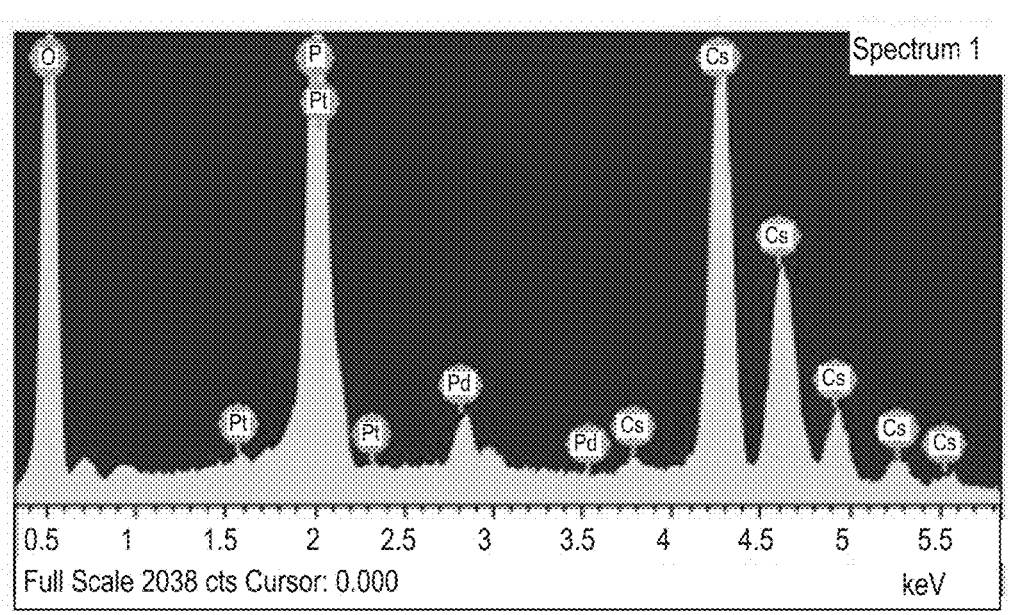

FIG. 5 shows scanning electron micrographs of the Pt—Pd alloy deposited on $CsH_2PO_4$ via method similar to that described in this example. Pt 4f and Pd3d XPS spectra for $Pd_{80}Pt_{20}$ nanoparticles formed on the surface of $CsH_2PO_4$ particles after processing similar to that described in this example are shown in FIG. 6. Samples were washed in water to remove $CsH_2PO_4$ particles and leave only Pt—Pd nanoparticles. Scanning electron micrograph (top) and associated EDS spectrum (bottom) of Pt—Pd alloy deposited on $CsH_2PO_4$ are shown in FIG. 7.

Example 4. Platinum on Alumina

A powder of 30 mg of platinum(II)(2,4)-pentanedionate $(Pt(acac)_2)$ was applied to the surface of an anodic alumina $(Al_2O_3)$ membrane (9 mg, 13 mm diameter, 200 nm pore size). The powder-covered disc was transferred to a vacuum oven containing 2.3 mL of DI water in a glass vial. Metal deposition within the porous alumina structure proceeded at 210° C. in a $N_2$/water vapor atmosphere via a protocol identical to the procedure in Example 1. This treatment deposited 12 mg of Pt nanoparticles (57 wt %) within the porous aluminum oxide.

Example 5. Ruthenium Oxide on Carbon Black

A powder of 100 mg of ruthenium (III)(2,4)-pentanedionate $(Ru(acac)_3)$ was added to 100 mg carbon black (Cabot Vulcan XC-72R) in a 4.5 mL capacity glass vial. Gentle shaking was used to mix the carbon and $Ru(acac)_3$ precursor in the vial. Metal deposition on CDP proceeded at 270° C. in a N2/water vapor atmosphere via a protocol otherwise identical to the procedure in Example 1. This treatment deposited 20 wt % amorphous ruthenium oxide nanoparticles on the surface of the carbon substrate.

Example 6. Platinum on CDP (Powder) with Dichloromethane

A borosilicate glass vial was filled with 80 mg of platinum (II)(2,4)pentanedionate (also known as Platinum acetylacetonate, $Pt(acac)_2$, 200 mg of $CsH_2PO_4$ (CDP) powder, and 2 ml of dichloromethane (DCM). The sample vial was capped and shaken vigorously by hand until the $Pt(acac)_2$ dissolved, giving the slurry mixture a uniform yellow color. The cap of the vial was removed and the DCM allowed to evolve. The vial, with dried powder of mixed $Pt(acac)_2$ and CDP, was then transferred to a vacuum oven. A separate 3.7-mL vial was then filled with 2.1 mL of deionized water and placed in the oven far from the vial containing the powder mixture. The oven was evacuated to 0.17 bar with a rotary vane vacuum pump and purged with dry $N_2$ three times. The oven was then evacuated again to 0.30 bar, and all valves were sealed. The thermostat was set to 210° C. and heating was started immediately, reaching equilibrium after approximately 75 min at a temperature of 210° C. and a total pressure of 0.8 bar. After 15 h, the heater was shut off, the water vapor was evacuated, and the oven was allowed to reach room temperature. This treatment deposited 16.1 wt % Pt nanoparticles on the surface of the CDP substrate.

Example 7. Platinum on CDP (Porous Disc) with Chloroform 100 mg of Pt(acac)$_2$ dissolved in 1 ml of chloroform (CLF), was as applied to the top surface of a porous disc composed of 500 mg CsH$_2$PO$_4$ 0.75 inches in diameter, formed by compression of CsH$_2$PO$_4$ powder at 8 MPa. The solution was absorbed into the porous disc and dispersed evenly, resulting in a uniform yellow color for the disc. The CLF evolved rapidly, to leave a uniform coating of Pt(acac)$_2$ on the CDP particles of the porous disc. Metal deposition on CsH$_2$PO$_4$ proceeded at 210° C. in a N2/water vapor atmosphere via a protocol identical to the procedure in Example 1. This treatment deposited a continuous, electrically conductive film of Pt nanoparticles on the surface and within the pore structure of the CsH$_2$PO$_4$ substrate. A total of 22 mg of Pt was deposited.

Example 8. Platinum/Palladium Alloy on CDP (Powder) with Dichloromethane

A glass shell vials was filled with 300 mg of CsH$_2$PO$_4$, 47.5 mg Pt(acac)$_2$ and 147.5 mg Pd(acac)$_2$ and 3 ml of dichloromethane (DCM). The sample vial was capped and shaken vigorously by hand until the Pt(acac)$_2$ and Pd(acac)$_2$ dissolved, giving the slurry mixture a uniform yellow/orange color. The cap of the vial was removed and the DCM allowed to evolve. The vial, with dried powder of mixed Pt(acac)$_2$ and CDP, was then transferred to a vacuum oven. Metal deposition on CsH$_2$PO$_4$ proceeded at 210° C. in a N2/water vapor atmosphere via a protocol identical to the procedure in Example 1. This treatment deposited 20 wt % Pt$_{20}$Pd$_{80}$ alloy nanoparticles on the surface of the CsH$_2$PO$_4$ substrate.

Example 9. Platinum/Palladium Alloy on Copper

Figure 8:
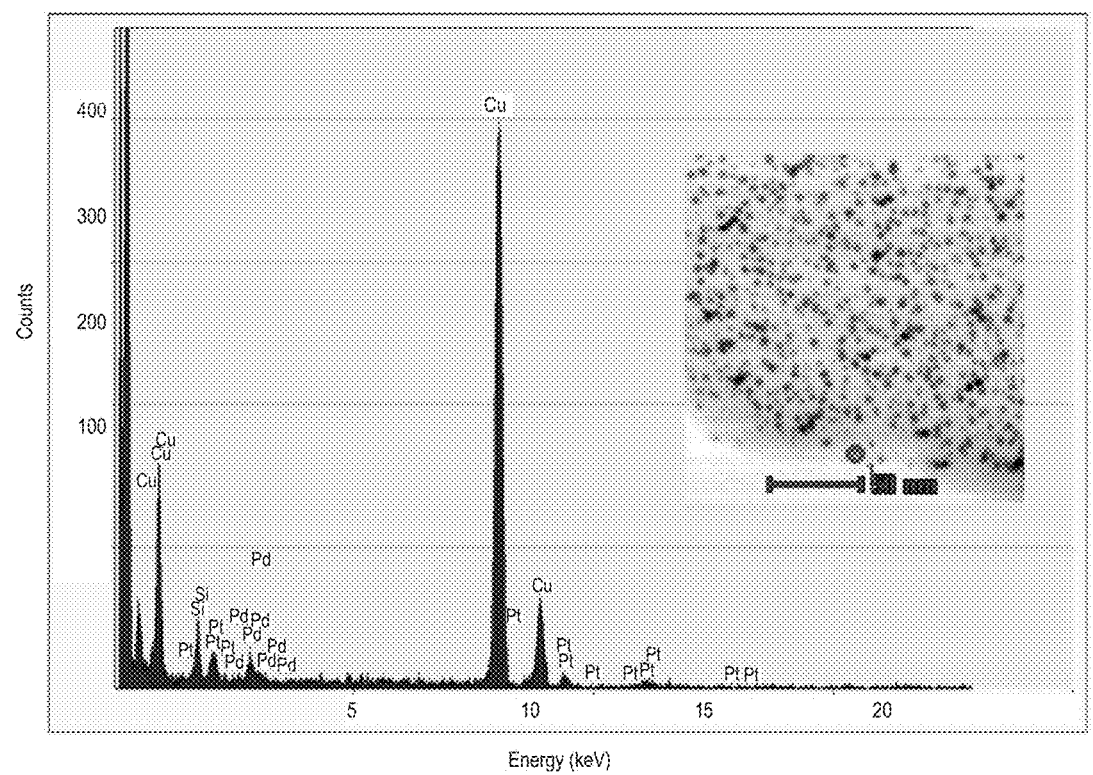
FIG. 8 shows a single-particle EDS spectrum for Pd—Pt nanoparticles formed on a copper TEM grid (inset).

A glass vial was filled with 10 mg Pt(acac)$_2$ and 30 mg Pd(acac)$_2$. Gentle shaking was used to mix the Pt and Pd precursors in the vial. The mixed precursors were spread over a high surface area copper TEM grid so that it was covered in powder. Metal deposition on the copper grid proceeded at 210° C. in a N2/water vapor atmosphere via a protocol identical to the procedure in Example 1. This treatment deposited alloy nanoparticles on the surface of the CsH$_2$PO$_4$ substrate of approximate composition Pt$_{20}$Pd$_{80}$. FIG. 8 shows scanning transmission electron micrograph Pd—Pt nanoparticles formed on a copper TEM grid (inset) via a procedure similar to that described in this example. The single-particle EDS spectrum shows the presence of Pt and Pd, indicating alloy formation.

Example 10. Platinum on Silicon Carbide

Figure 9:
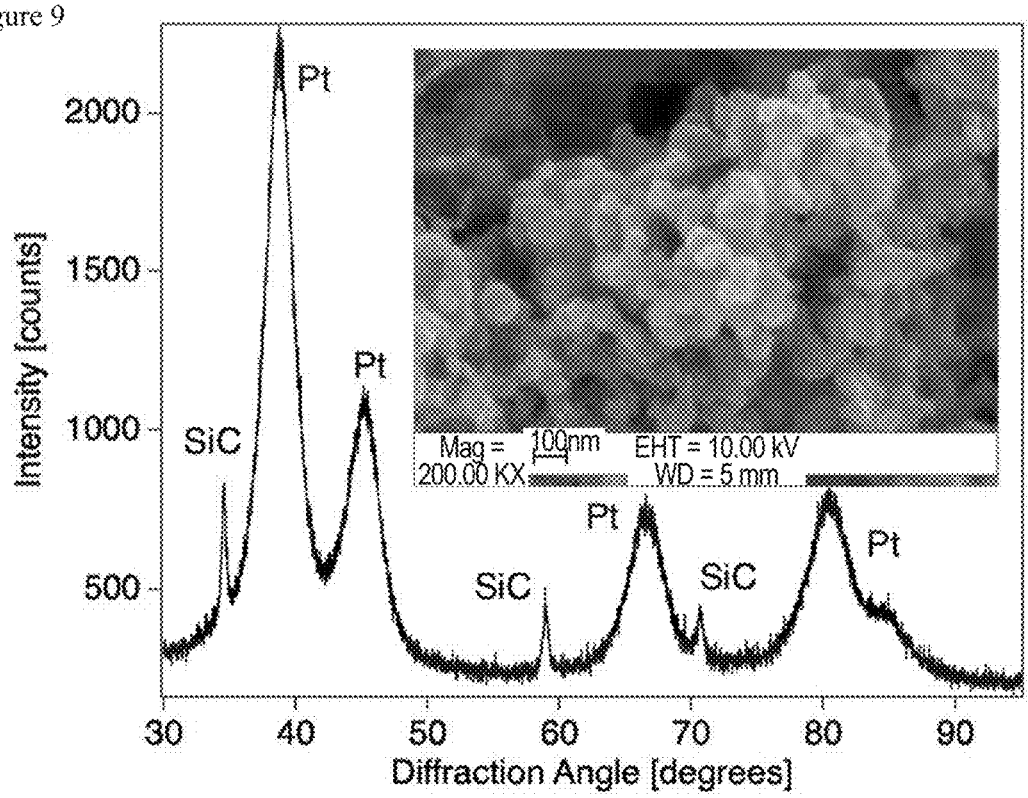
FIG. 9 shows the Cu Kα x-ray diffraction patterns of Pt nanoparticles deposited on nanoscale silicon carbide and a scanning electron micrograph of the sample (inset).

A powder of 100 mg of Pt(acac)$_2$ was added to 200 mg nanoscale silicon carbide (MKnano, Product number: MKN-SiCb-040) in a 4.5 mL capacity glass vial. Gentle shaking was used to mix the Pt(acac)$_2$ precursor and silicon carbide in the vial. Metal deposition on the silicon carbide proceeded at 210° C. in a N2/water vapor atmosphere via a protocol otherwise identical to the procedure in Example 1. This treatment deposited 20 wt % platinum nanoparticles on the surface of the silicon carbide substrate. FIG. 9 shows Cu Kα x-ray diffraction patterns of Pt nanoparticles deposited on nanoscale silicon carbide via a method similar to that described in this example. The inset image shows a scanning electron micrograph of the sample.

Example 11. Platinum on Carbon (Powder)

A powder of 100 mg of Pt(acac)$_2$ was added to 200 mg carbon (Cabot Vulcan XC-72R) in a 4.5 mL capacity glass vial. Gentle shaking was used to mix the Pt(acac)$_2$ precursor and carbon powder in the vial. Metal deposition on the carbon proceeded at 210° C. in a N2/water vapor atmosphere via a protocol otherwise identical to the procedure in Example 1. This treatment deposited 20 wt % platinum nanoparticles on the surface of the carbon substrate.

Example 12. Platinum on CDP (Powder)

Experimental Section

Four 3.7 mL borosilicate glass scintillation vials were filled with 20 mg, 40 mg, 80 mg and 160 mg of Pt(acac)$_2$ (Alfa Aesar, Pt 48% min, product No. 10526), respectively. To each of these vials was added 200 mg of fine CsH$_2$PO$_4$ (CDP) powder. The sample vials were capped and shaken vigorously by hand until the color of the powder mixture appeared a uniform, pale yellow. The caps of the vials were then removed and the vials transferred to a vacuum oven (VWR 1400E). A separate 3.7 mL vial was then filled with 2.1 mL of deionized (DI) water and placed in the oven far from the vials containing the powders. The oven was evacuated with a rotary vane vacuum pump and purged with dry N$_2$ three times. The oven was then evacuated again to 0.30 bar and all valves were sealed. The thermostat was set to 210° C. and heating was started immediately. The temperature and pressure of the oven were monitored with a bimetallic strip and a Bourdon tube, respectively. The chamber reached equilibrium after approximately 75 minutes at 210° C. and a total pressure of 0.8 bar.

After 15 hours at 210° C., the heater was shut off, the water vapor was evacuated, and the oven was allowed to reach room temperature. The sample powders were removed from the vials by gentle shaking onto waxed weighing paper. The powders were weighed and then passed through a stainless steel screen with 53 μm wire separation to homogenize the particulates.

Results and Discussion

Figure 15:
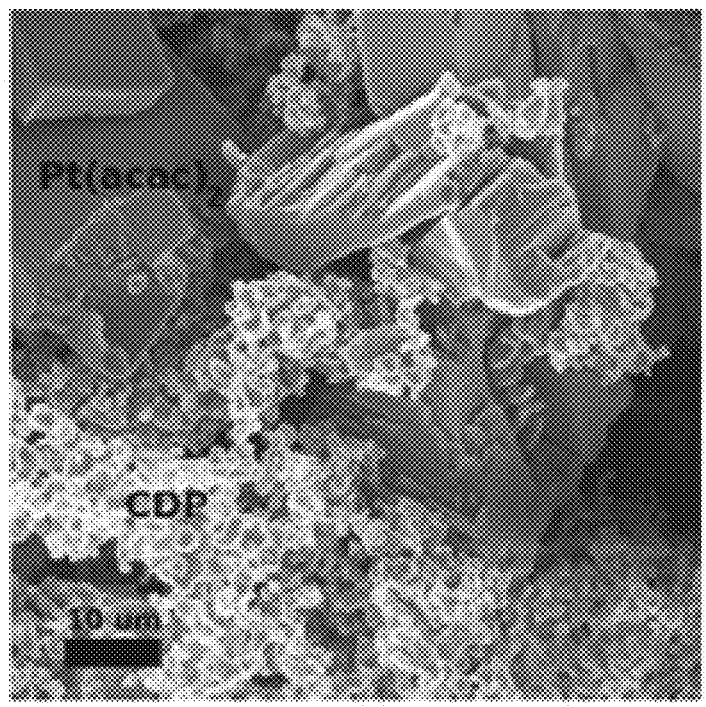
FIG. 15 shows an SEM micrograph of a CDP-$Pt(acac)_2$ precursor mixture containing 29 wt % $Pt(acac)_2$ prior to platinum deposition.

A scanning electron micrograph of a CDP-Pt(acac)$_2$ mixture (29 wt % Pt(acac)$_2$) is shown in FIG. 15. The large prismatic Pt(acac)$_2$ crystallites are easily distinguishable from the semi-spherical agglomerates of CDP.

After thermal treatment, the powders were weighed and each was found to have lost mass equal to the volatile weight fraction of the Pt(acac)2 component (52% of the precursor mass). Identically prepared mixtures powders were treated a second time at 210° C. in vacuum to check for additional mass loss due to unreacted precursor; none was measured.

High magnification SEM imaging of the powders after thermal treatment shows no remaining precursor particles and reveals the surface of the CDP particles to be conformally covered with a thin layer of nanoparticles. As the amount of Pt(acac)$_2$ precursor is increased, the thickness of the nanoparticle layer on the CDP qualitatively increases. The change of the surface coverage and morphology of the powders with increasing precursor weight fraction is shown in FIG. 10.

The chemical composition of each powder as measured by EDS comprised the elemental components of CsH$_2$PO$_4$ and Pt. Though the strong characteristic P K peak and the Pt M peak nearly overlap at approximately 2 kV, we attempted to quantify Pt content by means of the Pt/P weight ratio. The Pt/Cs ratio, though not confounded by overlapping peaks, was expected to lack accuracy due to a missing energy calibration standard for Cs on the instrument used. Indeed, the measured ratio of Cs to P deviates by approximately 10% to 20% from the true value of 1:1. Nevertheless, the results in Table 1 show very good agreement for the total amount of Pt compared to the calculated Pt/P weight ratios based on precursor Pt content. The sampling depth of the EDS technique is approximately 1 µm, similar to the primary CDP particle size, and it appears that entire particulate volumes have been sampled.

TABLE 1

EDS Measurements of Pt/P and Cs/P Weight Fractions in Pt:CDP Powders.

| Pt wt % | Pt/P (meas.) [$x_{at}$]$^a$ | Pt/P (calc.) | Pt/P deviation [%] | Cs/P error [%] |
|---|---|---|---|---|
| 5 | 0.345 ± 0.052 [0.06] | 0.361 | −4.4% | 19.6% |
| 9 | 0.604 ± 0.053 [0.10] | 0.722 | −16.3% | 11.0% |
| 17 | 1.450 ± 0.074 [0.24] | 1.444 | 0.4% | 11.1% |
| 29 | 2.494 ± 0.102 [0.41] | 2.888 | −13.6% | 10.5% |

$^a$Measured Pt/P Atomic Ratio is Shown in brackets.

Figure 16:
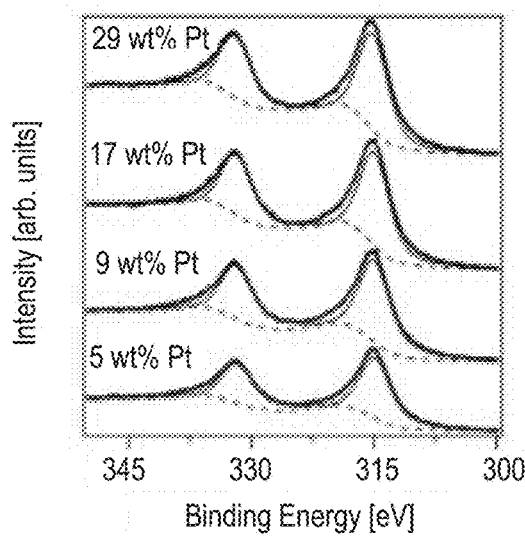
FIG. 16 shows XPS scans of the Pt 4d doublet of Pt:CDP samples. Solid lines are fits to $Pt^0$ peaks, and dashed lines are fits to Pt oxide/hydroxide peaks. A small C 1s loss peak at 313 eV is omitted in the displayed peaks.

High-resolution XPS scans of the Pt 4d doublet for each sample are presented in FIG. 16. The Pt 4d photoelectron peak was chosen due to the near overlap of the Cs 4d with the more intense Pt 4 f doublet. Three peak components were required to adequately fit the data, and are denoted as peak 1 (solid line) and peak 2 (dashed line), and peak 3 (not shown). Peak 3 is a small C 1s loss peak at 313 eV and is not shown for the sake of clarity. Peaks 1 and 2 were fit as a doublet with a fixed spin-orbit splitting of 16.9 eV. [Zsoldos, Z.; Hoffer, T.; Guczi, L. *J. Phys. Chem.* 1991, 95, 798-801] All peak centers are given in terms of the center of the $4d_{5/2}$ portion of the doublet. Peak 1, at 314.97±0.10 eV, is assigned to Pt metal in accordance with tabulated data [National Institute of Standards and Technology, NIST X-ray Photoelectron Spectroscopy Database, Version 3.5, 2003. See web address srdata.nist.gov/xps/], though the accepted position for the peak is 314.60 eV. Peak 2, at 318.88±0.19 eV, is assigned to $PtO_2$, though PtO and $Pt(OH)_x$ species cannot be ruled out due to the width of the peaks, which show similar chemical shifts when observed in the Pt 4 f peak. [Shukla, A.; Neergat, M.; Bera, P.; Jayaram, V.; M S, *J. Electroanal. Chem.* 2001, 504, 111-119; Hamnett, A.; Weeks, S. A. *Electrochim. Acta* 1987, 32, 1233-1238; Allen, G.; Tucker, P.; Capon, A.; Parsons, R. J. *Electroanal. Chem.* 1974, 50, 335-343; Blackstock, J.; Stewart, D.; Li, Z. *Appl. Phys.* A 2005, 80, 1343-1353.] The positions of the peaks and the ratio of Pt metal to oxide species are listed in Table 2. Pt oxides are less prevalent at higher Pt loadings. This is most likely due to Pt nuclei already present on the CDP surface acting to catalyze the $Pt(acac)_2$ decomposition reaction, which we discuss in more detail below.

TABLE 2

XPS Peak Positions and Ratio of $Pt^0$ to Pt oxides for Pt:CDP powders.

| | Pt $4d_{5/2}$ [eV] | | |
|---|---|---|---|
| Pt [wt %] | peak 1 | peak 2 | Pt/Pt$_{oxide}$ |
| 5 | 314.87 | 318.85 | 6.4 |
| 9 | 314.97 | 318.81 | 7.7 |

TABLE 2-continued

XPS Peak Positions and Ratio of $Pt^0$ to Pt oxides for Pt:CDP powders.

| | Pt $4d_{5/2}$ [eV] | | |
|---|---|---|---|
| Pt [wt %] | peak 1 | peak 2 | Pt/Pt$_{oxide}$ |
| 17 | 314.92 | 318.66 | 9.1 |
| 29 | 315.1 | 319.10 | 9.7 |

Figure 17:
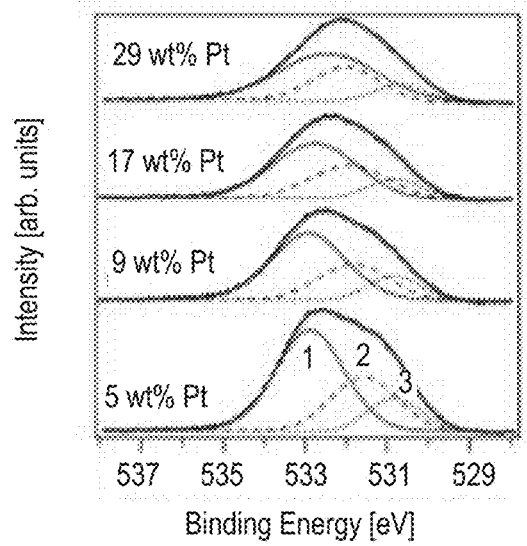
FIG. 17 shows XPS scans of the O 1s peak of Pt:CDP samples. The assignment of peaks 1, 2, and 3 is described in the text.

The interpretation of O 1s photoelectron peaks in the Pt:CDP system is quite complicated. High-resolution scans from the sample powders are presented in FIG. 17. Three peak components fit the spectra quite well, but the assignment of these peaks is difficult. The largest of the components, at 532.75±0.24 eV, is likely a from $nCH_2CH_2O$-type species resulting from incomplete ligand decomposition. The peak at 530.76±0.11 eV decreases monotonically with Pt loading, and we can assign it with some confidence to the $PO_4$ group of the underlying CDP. The peak at 531.815±0.19 eV is likely to contain components from surface hydroxyl groups, $PtO_2$, and $Pt(OH)_x$. We compared the relative magnitudes of the peaks by normalizing them to the intensity of the most intense peak at 532.75 eV. These results are summarized in Table 3.

Figure 18:
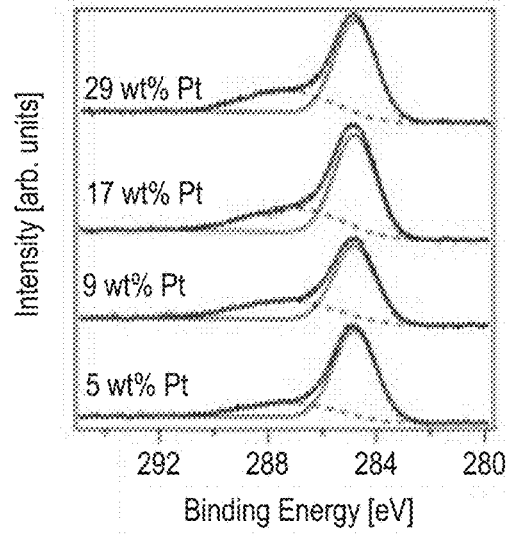
FIG. 18 shows XPS scans of the C 1s peak of Pt:CDP samples. The larger, adventitious carbon peak at 284.8 eV was used as an internal energy standard, and is fit with a solid line. The dashed peak is assigned to organic species resulting from retained organic fragments of the $Pt(acac)_2$ precursor.

C 1s peak scans are presented in FIG. 18. In addition to the adventitious peak that has been used as an internal energy reference at 284.8 eV, the C 1s peaks also show evidence of a chemical shift at 287.24±0.14 eV. This peak is assigned most generally to organic fragments from incomplete decomposition of the $Pt(acac)_2$ precursor. The ratio of adventitious carbon to unknown carbon species is presented in Table 4. There may be evidence for a small autocatalytic effect for decomposition of organic contaminants, but there is no correlation of that effect beyond the lowest Pt loading.

TABLE 3

XPS Peak Positions and Intensities for O 1s Peaks for Pt:CDP Powders.

| Pt wt % | Peak 1 pos. [eV] | Peak 2 pos. [eV] | Peak 2 int. | Peak 3 pos. | Peak 3 int. |
|---|---|---|---|---|---|
| 5 | 532.9 | 531.6 | 0.51 | 530.8 | 0.25 |
| 9 | 532.9 | 531.8 | 0.49 | 530.8 | 0.25 |
| 17 | 532.8 | 531.9 | 0.55 | 530.8 | 0.24 |
| 29 | 532.4 | 532.0 | 0.51 | 530.6 | 0.21 |
| Assignment | $nCH_2CH_2O$ | OH, $PtO_2$, $Pt(OH)_x$ | | $PO_4$ | |

TABLE 4

XPS Peak Positions and Ratio of Adventitious C to Unknown C for Pt:CDP Powders.

| Pt [wt %] | C [eV] | $C_{unknown}$ [eV] | $C/C_{unknown}$ |
|---|---|---|---|
| 5 | 284.8 | 287.26 | 2.82 |
| 9 | 284.8 | 287.35 | 1.80 |
| 17 | 284.8 | 287.03 | 1.89 |
| 29 | 284.8 | 287.30 | 2.14 |

Figure 19:
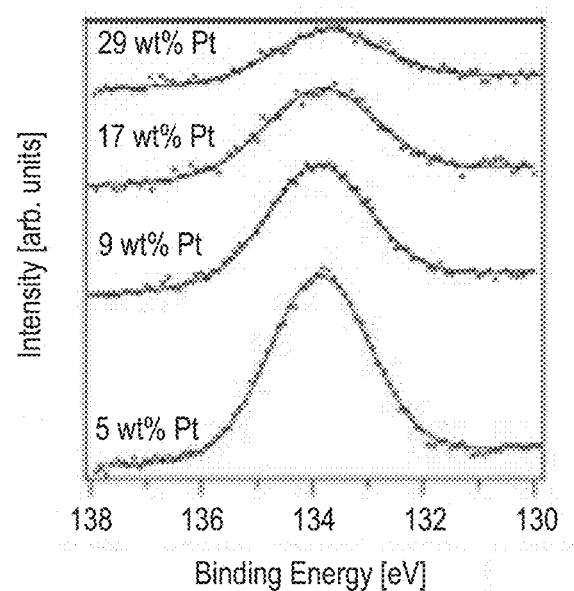
FIG. 19 shows XPS scans of the P 2p peak of Pt:CDP samples and the single fitted peak.

High resolution scans of the P 2p peaks for the samples are shown in FIG. 19. Only one peak component is present at 133.8±0.08 eV, which is expected given the nature of the ionic bonding in the CDP support. The intensity of the peak decreases with increasing platinum content, due to combined effect of increasing Pt coverage and the absorption of the emitted P photoelectrons by the Pt nanoparticle overlayer.

To estimate the thickening of the Pt nanoparticle layer on the CDP surface, the Pt/P atomic ratio was calculated using the integrated intensities of the Pt 4d5/2 and P 2p peaks and the associated atomic sensitivity factors. This approach does not explicitly account for the attenuation of the P 2p photoelectrons by the supported Pt nanoparticle layer or the varying coverage of the support at low Pt loadings. The calculated Pt/P atomic ratios for 5, 9, 17, and 29 bulk wt % Pt are 1.76, 3.16, 4.25, and 6.27, respectively. These results are significantly increased with respect to the EDS results in Table 1 due to the extreme surface sensitivity of the XPS technique.

The XPS data show that $Pt^0$ is the dominant species present in the supported nanoparticles, but that $Pt^{II}$ and $Pt^{IV}$ are also likely to be present. Assorted organic species differentiable from adsorbed water and hydrocarbons are also present, though the precise makeup of these compounds cannot be inferred unambiguously. We note that Pt oxides are not deleterious for fuel cell performance, because the oxides are reduced electrochemically during operation. High concentrations of organic species may block catalytic sites, however.

To visually estimate the maximum average thickness of the Pt nanoparticle films, the assumptions of 100% Pt yield and perfect conformal coating were adopted. Based on these assumptions, the thickness of the Pt film is $$t = \frac{1000\emptyset}{\rho_{Pt}\sigma_{cdp}}$$

Figure 20:
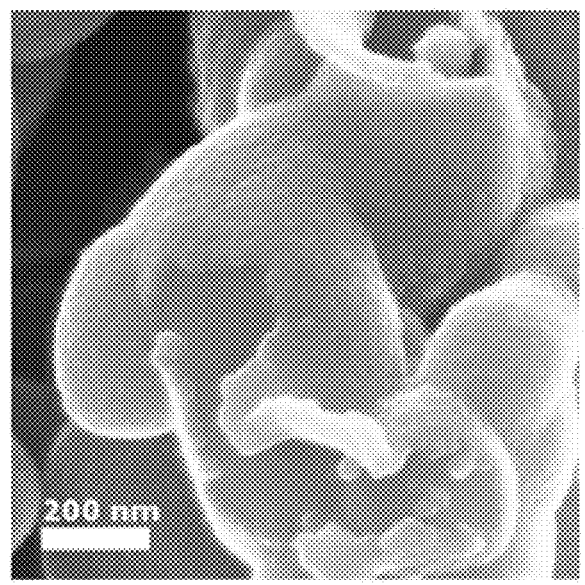
FIG. 20 shows SEM micrograph of 400 mg of Pt (50 wt %, 50 nm) deposited on 200 mg of CDP powder.

Here, t is the film thickness in nm, $\phi$ is the ratio of platinum to CDP mass, $\rho_{Pt}$ is the density of Pt (taken to be 21.46 g/cm$^3$) and $\sigma_{cdp}$ is the specific surface area of the CDP in m$^2$/g. Nitrogen adsorption measurements found the specific surface area of the CDP particles discussed here to be 2.4 m2/g. The maximum uniform film thicknesses expected from the experimental samples (10 mg, 20 mg, 40 mg and 80 mg of Pt per 200 mg of CDP) are thus 1 nm, 2 nm, 4 nm, and 8 nm, respectively. From inspection of the SEM micrographs this appears to be a useful model for characterizing the results of the Pt deposition process. FIG. 20 shows a powder sample prepared with a 50 wt % Pt loading, and is the most illustrative. A cohesive, thick Pt film appears edge-on, and pixel-based measurement of the film thickness with the program ImageJ [Rasband, W. S. *ImageJ*. See web address rsb.info.nih.gov/ij/] returned a thickness of 42±3 nm, while the model suggests a film thickness of 53 nm.

TABLE 5

Pt Structural Parameters from XRD

| Loading [wt % Pt] | Lattice Parameter [nm] | Particle Size [nm] |
|---|---|---|
| 5 | 0.3916 | 2.4 |
| 9 | 0.3912 | 2.8 |
| 17 | 0.3904 | 3.2 |
| 29 | 0.3910 | 3.7 |

Figure 11:
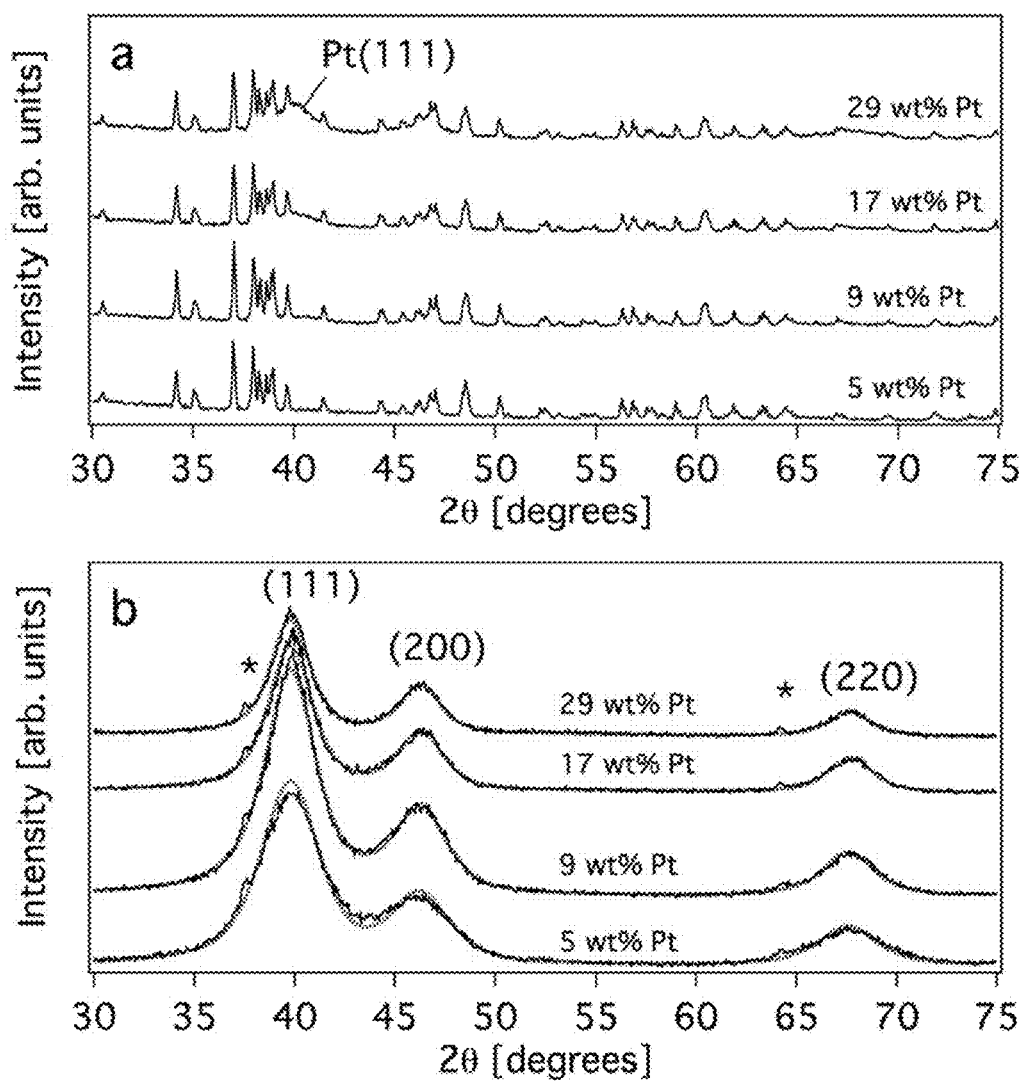
FIG. 11 shows Cu Kα x-ray diffraction patterns of Pt nanoparticles (a) deposited on $CsH_2PO_4$ and (b) with the water-soluble $CsH_2PO_4$ substrate removed by dissolution.
Figure 12:
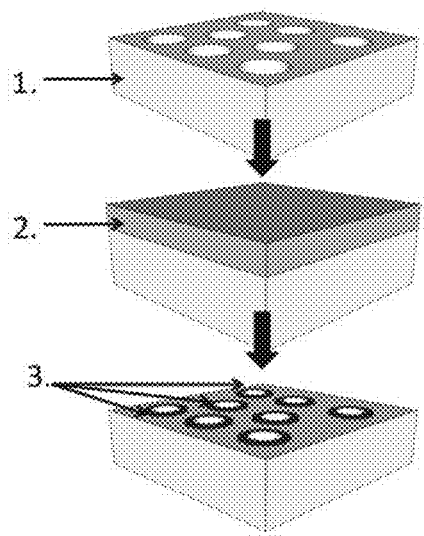
FIG. 12 shows deposition of continuous nanoparticle films (3) within a porous substrate material (1). A powder of precursor material (2) is placed in contact with the substrate prior to deposition heat treatment; a nanoparticle film is formed within the pores of the substrate material
Figure 13:
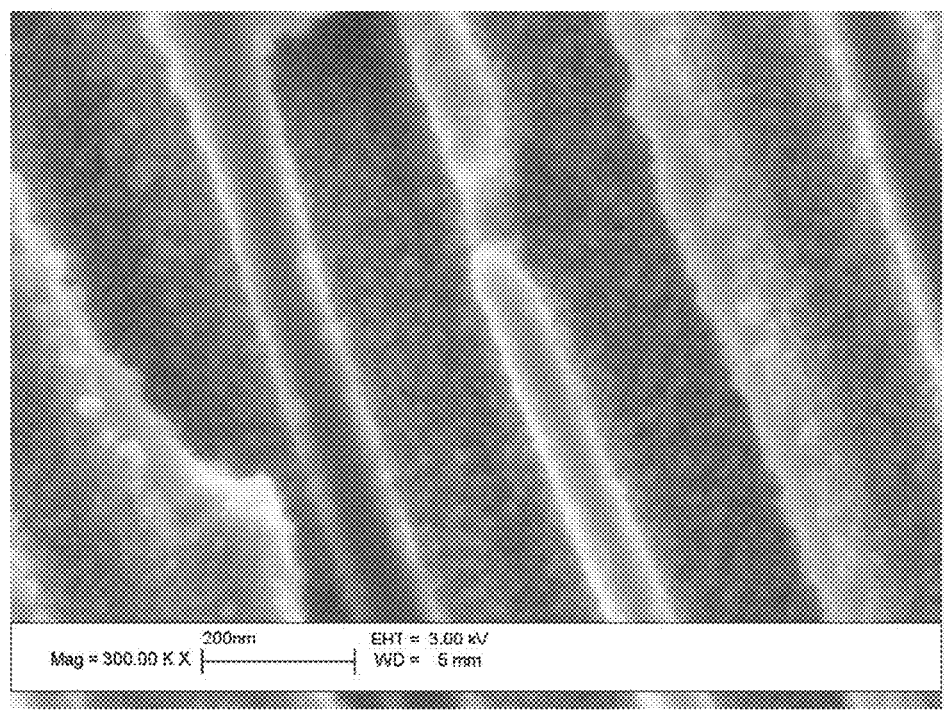
FIG. 13 shows a scanning electron micrograph of Pt nanoparticle film formed within the pores of an anodic aluminum oxide porous membrane material.

X-ray diffraction patterns from the as-coated powders and the washed powders are shown in FIG. 11. In the upper portion of the figure, the sharp, highly multiple diffraction peaks of CDP are overlaid on an envelope of broad peaks with the fcc symmetry of Pt. The intensity of the Pt peaks increase with increasing Pt content. In the lower portion of the figure, clear Pt fcc patterns are evident for the washed samples. Rietveld refinement of the washed Pt patterns using the fcc Pt structure [Swanson, H.; Tatge, E. National Bureau of Standards (U.S.), Circular 1953, 539, 1] returned for each sample a lattice parameter and width of the Pt(111) peak (d-spacing=0.2265 nm; 2θ=39.765°. Average Pt particle diameters t were calculated using the Scherrer equation:

$$t = \frac{0.9\lambda}{B\cos\theta}$$

Here, B is the full width at half maximum intensity of the peak, θ is the Bragg angle, and for Cu $K\alpha_1$, λ=0.154060 nm. The results are presented in Table 5 below.

The refined lattice parameters are systematically lower than the value for bulk platinum of 0.39231 nm. Lattice contraction in small metal nanoparticles is a well-known phenomenon and has been observed for Pt [Klimenkov, M.; Nepijko, S.; Kuhlenbeck, H.; Bäumer, M.; R, *Surf. Sci.* 1997, 391, 27-36], Pd [Lamber, R.; Wetjen, S.; Jaeger, N. *Phys. Rev. B* 1995, 51, 10968-10971], and other fcc metals. [Montano, P.; Shenoy, G.; Alp, E.; Schulze, W.; Urban, J. *Phys. Rev. Lett.* 1986, 56, 2076-2079] The increase of the average Pt grain size with increased precursor loading is indicative of a nucleation and growth process in which Pt nuclei initially formed on the surface of CDP act to catalyze further Pt reduction and particle growth.

Figure 21:
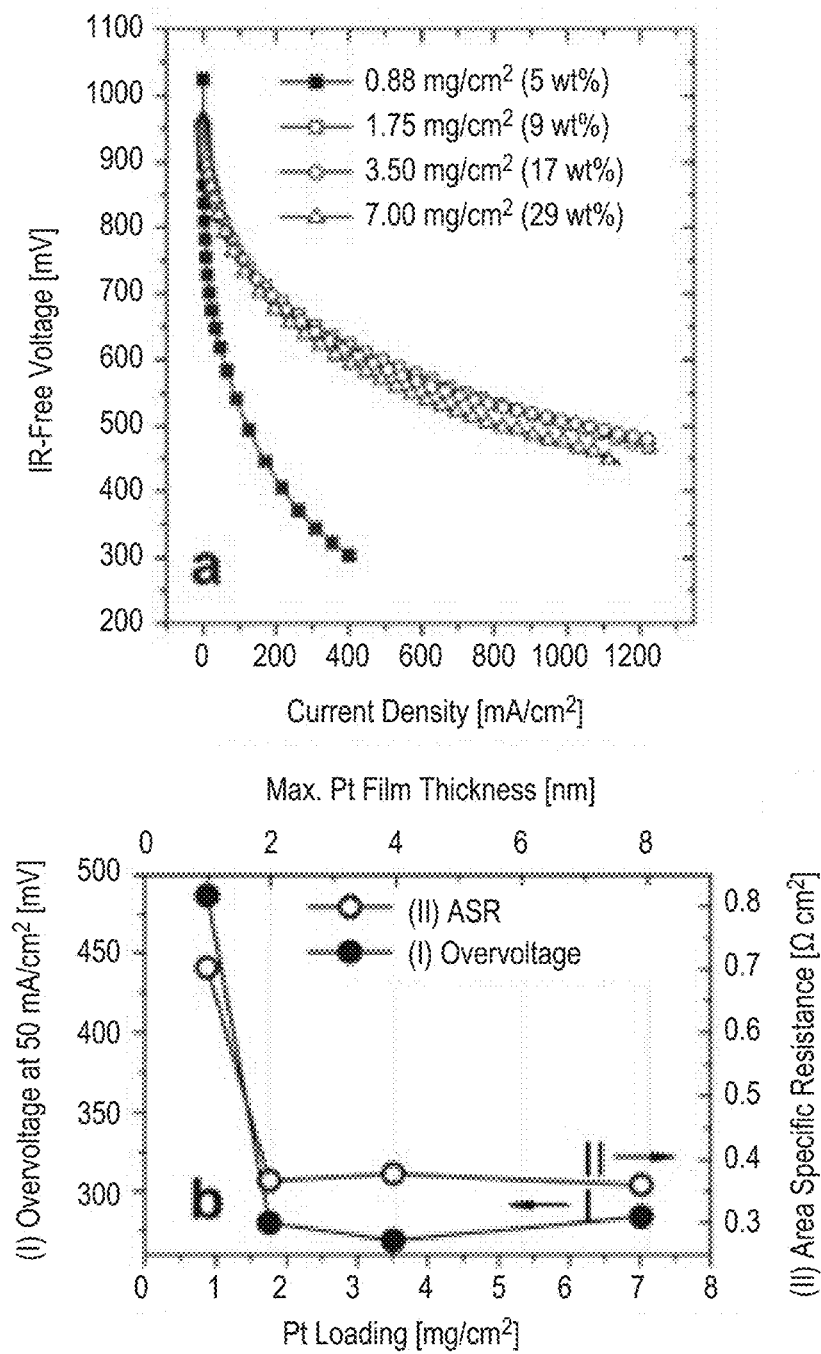
FIG. 21 shows plot of (a) voltage drop from 1.1 V at 50 mA/cm$^2$ and (b) ohmic resistance of SAFC electrodes, as a function of platinum loading. Each electrode contained 50 mg of CDP.

The polarization curves drawn from each of the experimental electrodes, after correction for ohmic resistance, are shown in the upper portion of FIG. 21. The large overpotentials are typical of SAFC cathodes [Haile, S.; Chisholm, C.; Sasaki, K.; Boysen, D.; Uda, T. Faraday Discuss. 2007, 134, 17; Chisholm, C.; Boysen, D.; Papandrew, A. B.; Zecevic, S.; Cha, S.; Sasaki, K. A.; Varga, A; Giapis, K. P.; Haile, S. M. *Electrochem. Soc. Interface* 2009, 18, 53-59], which have a paucity of active catalyst sites. Still, the electrode with 0.88 mg/cm$^2$ of Pt has a far higher overvoltage than the electrodes with thicker Pt films. We quantified these overpotentials by measuring the difference between the cell voltage and 1.1 V at a current density of 50 mA/cm$^2$. The reference voltage was arbitrarily chosen to be approximately equal to the theoretical Nernst potential for H$_2$/air in the presence of 0.3 atm H$_2$O at 250° C., which is 1.12 V for a hydrogen reversible electrode under these conditions. The measured overpotentials and ohmic resistances are plotted against Pt loading in the lower portion of FIG. 21.

The large increases in both values at 0.88 mg/cm$^2$ are related. At this loading the average particle size from XRD is 2.4 nm (Table 5) while the maximum calculated average film thickness is 1 nm. If we discount a preponderance of anisotropic particle shapes it is clear that complete coverage of the available CDP surface area by Pt is not possible. As the Pt coverage of the CDP network becomes sparse, the electronic path density drops, leading to an attendant increase in the ohmic resistance. Similarly, Pt nanoparticles that are not connected to the electronic conduction network cannot be active catalytically, and the overpotential for the electrode is increased.

Above this threshold for complete coverage of the CDP network by Pt, there is no effect of the addition of additional Pt, as shown by the nearly identical activation overvoltages of the remaining samples (FIG. 21). The increase of the Pt particle diameter from 2.8 nm to 3.7 nm with increased loading has no impact on the oxygen reduction activity of the electrodes, despite the strong dependence of oxygen reduction activity on Pt particle diameter [Mukerjee, S.;

McBreen, J. J. *Electroanal. Chem.* 1998, 448, 163-171; Mayrhofer, K. J. J.; Blizanac, B. B.; Arenz, M.; Stamenkovic, V. R.; Ross, P. N.; Markovic, N. M. *J. Phys. Chem. B* 2005, 109, 14433-40]. This is clear evidence that it is the electrochemical surface area of the CDP electrolyte, not the Pt catalyst, that dominates the performance of SAFCs. In the case of the highest loading tested, fuel cell performance can be seen to decrease slightly, but at the high current densities indicative of transport losses, rather than kinetic losses. We attribute this effect to an inhibition of proton transport related to constricted particle-to-particle proton conduction pathways in the presence of increasingly thick Pt nanoparticle layers.

Figure 22:
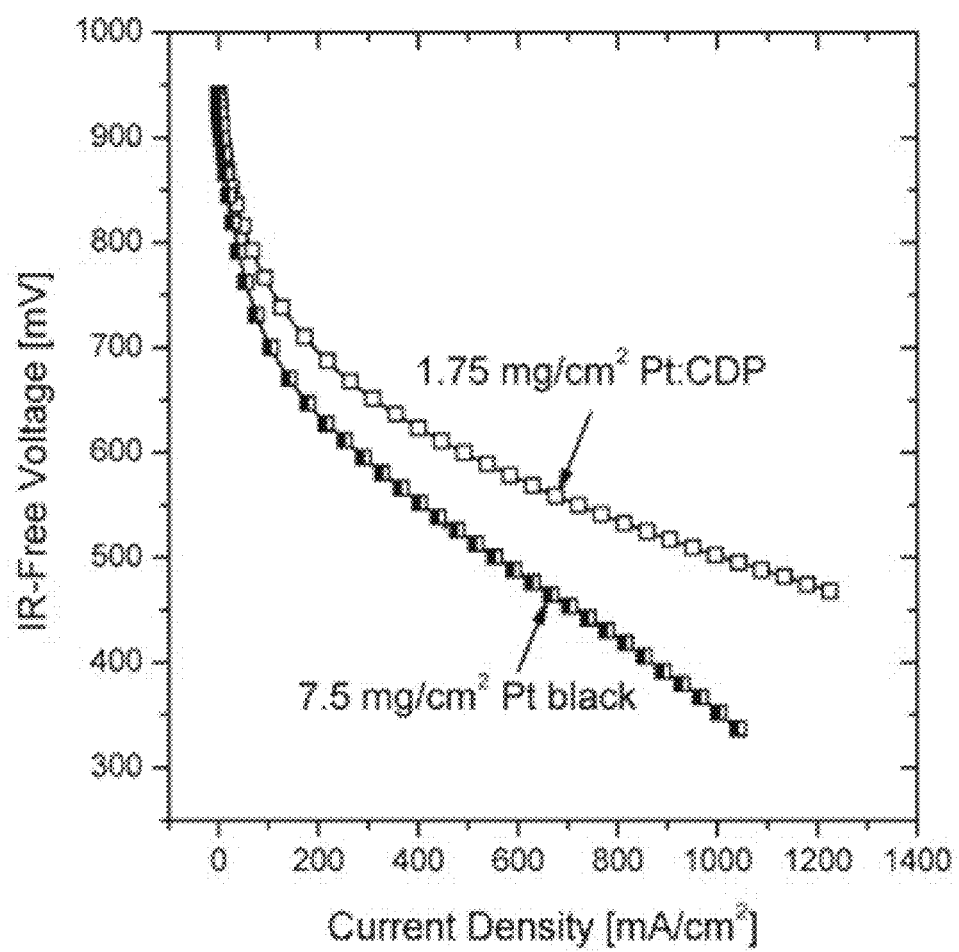
FIG. 22 shows IR-free polarization curves of a standard SAFC electrode and a Pt:CDP electrode.
Figure 23:
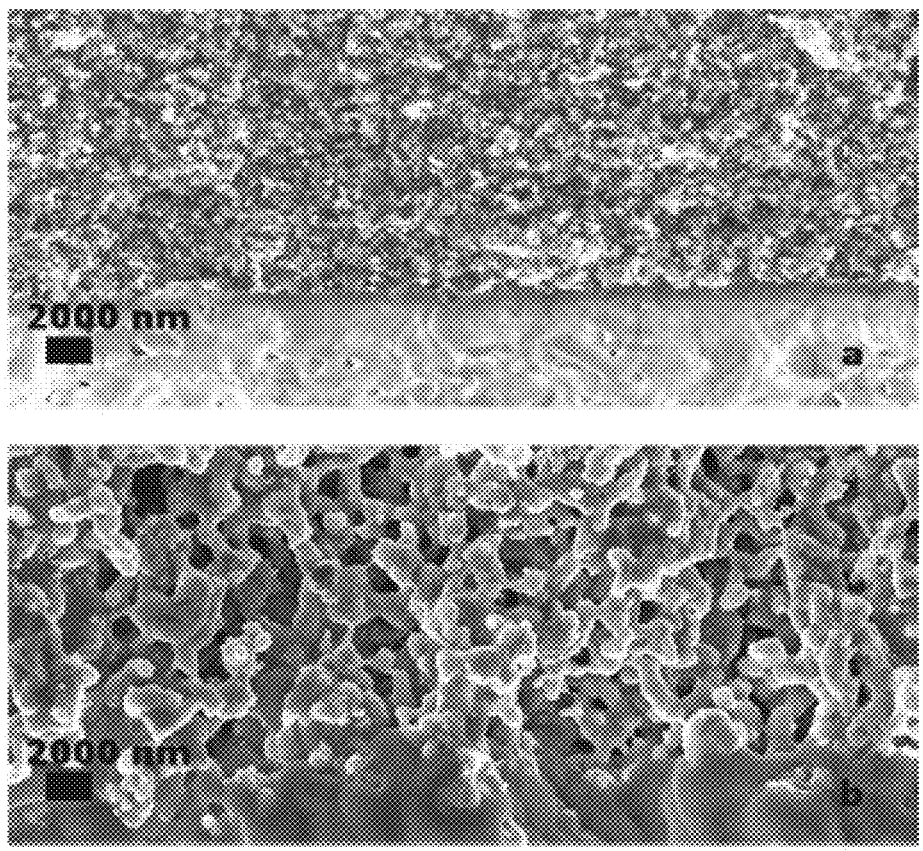
FIG. 23 shows cross-section electron micrographs of SAFC electrodes: (a) standard SAFC electrode containing Pt black and (b) Pt:CDP electrode.

Comparisons of the Pt:CDP electrode to the first generation standard SAFC electrodes are favorable. The standard electrode consists of a mechanical mixture of 37.5% Pt black (HiSPEC 1000, Alfa Aesar), 37.5% CDP, 12.5% 0.4Pt on XC-72R (HiSPEC 4000, Alfa Aesar), and 12.5% naphthalene as a fugitive binder/poreformer. The electrode weighed 50 mg, and had an area specific platinum loading of 7.5 mg/cm$^2$. It was formed in the same fashion as the Pt:CDP electrodes, but bonding of the electrode to the membrane proceeded at 120 MPa for 1 minute. A representative IR-free polarization curve from the standard electrode is compared to an experimental electrode in FIG. 22. The experimental electrode exhibits an overvoltage at 50 mA/cm$^2$ that is lower by 50 mV and has a voltage in excess of the standard electrode at the higher current densities. Gas diffusion losses are negligible in the Pt:CDP electrode due to its open structure as a result of being laminated at 8 MPa. The standard electrode is far more dense and thus more acutely affected by gas diffusion losses. A comparison of the two electrode microstructures is shown in FIG. 23.

Figure 24:
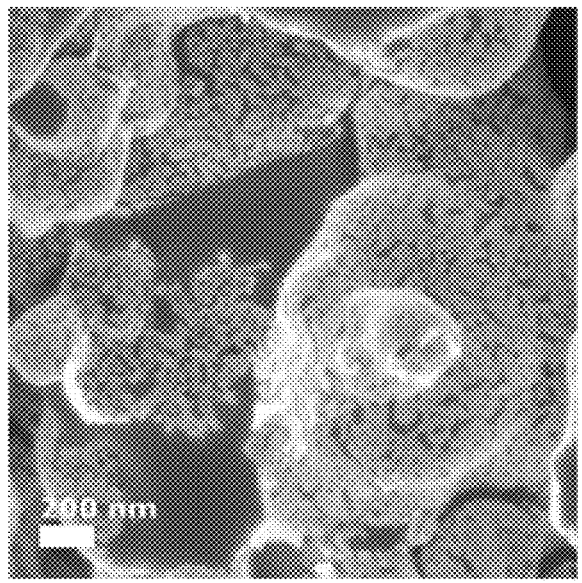
FIG. 24 shows an electron micrograph of a Pt:CDP cathode after fuel cell operation. The bright Pt nanoparticles have reorganized on the darker CDP surface.

The experimental Pt:CDP electrodes display adequate stability over moderate operation time. An electrode with 1.75 mg/cm$^2$ of platinum and 50 mg of CDP was operated at a constant current density of 200 mA/cm$^2$ at 250° C., with 30/60 sccm H$_2$/air at 75° C. dew point. Over the course of 200 hours, the experimental electrode decreased in voltage at a linear rate of 110 μV/hr. Under the same operational conditions, the standard electrode degrades at the same rate. Voltage decay in SAFCs is a key impediment to commercial adoption, and is still not completely understood. We attribute the major modes of voltage loss to changes in the cathode microstructure related to the properties of the CDP electrolyte. CDP is superplastic in its superprotonic phase, leading to large enhancements of the sintering rate of the individual particles in the electrode during fuel cell operation. Sintering closes active catalyst sites to reactant gases, reducing overall catalytic activity and impairing gas diffusion. A concurrent mechanism that has been observed in post-operation SEM studies of Pt:CDP electrodes is a reorganization of the platinum nanoparticles on the surface of the supporting CDP, shown in FIG. 24. The high degree of dynamic disorder in the CDP lattice in the superprotonic phase may foster fast diffusion of Pt atoms, leading to clustering of Pt and eventual disruption of the catalytic-electronic network on the nanoscale. Alternately, Pt may be transported by a vehicle mechanism due to the formation of small domains of the liquid-like metastable phase of CDP.

We are not aware of other methods of platinum deposition that result in the continuous nanoparticle networks that enable the demonstrated electrode advances. The nature of these networks suggest that the surface chemistry of CDP has considerable influence on the deposition process. An infrared spectroscopy study of Pt(acac)$_2$ interactions with surface sites in alumina supports a dissociative mechanism facilitated by surface acidity, and CDP is considerably more acidic than alumina.

In that case, following physisorption of Pt(acac)$_2$ on CDP from the vapor phase, chemisorption will proceed as one acac ligand is dissociated by ligand exchange with surface hydroxyls. The surface of CDP will then contain protonated acac, acacH, and a Pt—O bond. This reaction is thermodynamically favorable and will yield an ionic Pt—O intermediate. The loss of the second acac ligand will then proceed rapidly, yielding a Pt$^{II}$ oxo-type species. Reduction to the dominant Pt$^0$ species is likely to occur via a two-electron process concomitant with the oxidation of acacH. The minority oxidized Pt species detected by XPS may result from an incomplete reaction or from reaction of Pt$^0$ with activated surface-bound water. Based on thermogravimetric analysis-mass spectroscopy (TGA-MS) experiments of the decomposition of Pt(acac)$_2$ on related surfaces, acetone, CO, and CH$_4$ are probable byproducts of ligand oxidation. CO may result from decarbonylation of a biacetyl intermediate, as observed in other ligand-mediated reductions of metal centers. It is also possible that radical mechanisms may be occurring under the reaction conditions.

While we cannot rule out an associative mechanism for CDP, in which a phosphate group acts as a nucleophile, followed by the loss of anionic acac, this is not as likely, given the favorable hydrogen-bonding interaction that may exist between the phosphate group and acac ligand and the rather poor nucleophilicity of phosphate (as opposed to phosphines).

Beyond its primary role in preventing the dehydration phase transformation in CDP during the deposition process, water may have ancillary effects on Pt deposition. First, water vapor may decrease the activation energy required for deposition, as was observed in related surface-mediated processes. The transition state will involve a structure that has a formation of a Pt$^{II}$-surface bond and that transition state may be stabilized by hydrogen bonding with water. The presence of water in the chamber may also assist the protonation of the acac ligand to form neutral acetylacetonate, which will be adsorbed on CDP. As CDP has acidic sites, this may only be a secondary consideration. Water may also occupy surface sites to restrict diffusion of Pt atoms, giving a higher density of nucleation and a smaller average crystallite size.

The hypothesized role of the substrate surface suggests much broader catalysis applications of this technique. Carbon, silica, and alumina are workhorse catalyst supports with acidic surfaces and copious adsorbed water. Success in applying our technique to these supports seems likely and offers single-stage processing, fine control over the metal loading, and very high precursor yield. Moreover, the continuous Pt films formed by the addition of larger amounts of precursor suggest the facile synthesis of novel core-shell nanoparticle structures. The demonstrated coating of the available electrolyte surface area has profound implications for further development of SAFC technologies, using the reported technique. To increase the cathode activity and decrease the significant oxygen reduction overpotential, a higher density of active triple points must be created. The most direct way to achieve this aim is to decrease the average particle size of the CDP in the electrode. As a consequence, the surface area of the electrolyte particles must increase.

Of course, following our development above, this would necessitate a corresponding increase in platinum loading for adequate surface coverage and catalytic activity. However, for an electrolyte with a relatively low proton conductivity, such as CDP, the reaction zone for oxygen reduction is highly biased toward the interface with the membrane. It is thus possible that platinum loading may be dropped significantly by the incorporation of a substantially thinner, highly nanostructured electrode.

Example 12. Preparation of Electrodes

Electrodes were formed by spreading the coated powders over an anode-supported half-cell with a total area of 2.85 cm² and a CDP membrane thickness of 50 μm, similar to those described elsewhere [Uda, T.; Haile, S. *Electrochem. Solid-State Lett.* 2005, 8, A245], followed by compression of the powder at 8 MPa for 3 seconds. The mass of CDP electrolyte in each electrode was kept constant at 50 mg, and the area-specific platinum loading of the electrodes was 0.88 mg/cm², 1.75 mg/cm², 3.5 mg/cm², and 7 mg/cm², respectively. Nickel foam current collectors (INCO) were sealed against each electrode with PTFE tape (McMaster-Carr, part #4591K11) to complete the fabrication of the SAFC MEA.

Each MEA was loaded into a stainless steel test fixture and installed in a test rig. The test fixture was heated to 250° C. and supplied with an anode reactant flow of 30 sccm of $H_2$ and a cathode flow of 60 scmm of air. Both reactant streams were hydrated to a dew point of 75° C. After 12 minutes of equilibration, a polarization curve was measured with a galvanostat (Keithley 2420) from zero current in increasing steps at a rate of 0.5 s per current step. Up to 200 mA, 200 current steps were distributed according to the function $$i[mA]=10^{x/2.3}-1,$$

where the value of x ranges from 0 to 199 in unit steps; thereafter the current step was 5 mA. The maximum current for the measurement was the current at which the cell voltage was zero. Immediately after the polarization measurement, the ohmic resistance of the cell was measured by the current interrupt technique. [Chisholm, C. R. I.; Boysen, D. A.; Hettermann, M. L.; Papandrew, A. B. U.S. Pat. No. 7,577,536, 2009.]

Although the foregoing invention has been described in some detail by way of illustration and example for purposes of clarity of understanding, one of skill in the art will appreciate that certain changes and modifications can be practiced within the scope of the appended claims. In addition, each reference provided herein is incorporated by reference in its entirety to the same extent as if each reference was individually incorporated by reference.

What is claimed is:

1. A method of preparing metal particles or metal oxide particles on a substrate, comprising:
   heating a chamber to a single temperature, wherein the chamber contains a reaction mixture comprising a metal precursor or metal oxide precursor and a substrate, such that the metal precursor or metal oxide precursor is vaporized in the chamber and metal particles or metal oxide particles are formed on the substrate.

2. The method of claim 1, wherein the metal precursor or metal oxide precursor comprises at least one metal selected from the group consisting of a transition metal and a post-transition metal.

3. The method of claim 1, wherein the metal precursor or metal oxide precursor comprises at least one metal selected from the group consisting of Pt, Pd, Ir, Ru, Ni, Co, Fe, Cu, V, Cr, Ti, Ta, Mn, Mo, Nb, and Sn.

4. The method of claim 1, wherein the metal precursor or metal oxide precursor comprises at least one metal selected from the group consisting of Pt, Pd and Ru.

5. The method of claim 1, wherein the metal precursor or metal oxide precursor comprises Pt.

6. The method of claim 1, wherein the metal precursor or metal oxide precursor comprises Pt and Pd.

7. The method of claim 1, wherein the substrate comprises at least one member selected from the group consisting of a metal, a carbon material, a metal oxide, a silica material, a polymeric material, a solid acid, a solid oxide, and a metal salt.

8. The method of claim 1, wherein the substrate comprises a solid acid.

9. The method of claim 1, wherein the substrate comprises at least one member selected from the group consisting of $CsH_2PO_4$ and alumina.

10. The method of claim 1, wherein the substrate comprises $CsH_2PO_4$.

11. The method of claim 1, wherein the metal precursor or metal oxide precursor comprises Pt, and the substrate comprises $CsH_2PO_4$.

12. The method of claim 1, wherein the substrate is selected from the group consisting of a powder, a porous substrate and a solid substrate.

13. The method of claim 1, wherein the substrate is selected from the group consisting of a porous substrate and a solid substrate, such that the metal particles or metal oxide particles form a continuous network of particles on the surface of the substrate.

14. The method of claim 1, wherein the reaction mixture further comprises a solvent selected from the group consisting of dichloromethane, chloroform and carbon tetrachloride.

15. The method of claim 1, wherein the heating is at a temperature of from about 20 to about 500° C.

16. The method of claim 1, wherein the heating is at a temperature of from about 20 to about 300° C.

17. The method of claim 1, wherein the heating is at a temperature of from about 20 to about 210° C.

18. The method of claim 1, wherein the heating is performed at a pressure of from about 0.01 to less than 1 atm.

19. The method of claim 1, wherein the heating is performed at a pressure of from about 0.2 to about 0.9 atm.

20. The method of claim 1, wherein the metal precursor or metal oxide precursor is in direct physical contact with the substrate.

* * * * *